(12) United States Patent
Sharon et al.

(10) Patent No.: US 9,070,453 B2
(45) Date of Patent: Jun. 30, 2015

(54) MULTIPLE PROGRAMMING OF FLASH MEMORY WITHOUT ERASE

(75) Inventors: Eran Sharon, Rishon Lezion (IL); Idan Alrod, Herzliya (IL); Simon Litsyn, Giv'at Shmuel (IL); Ishai Ilani, Dolev D. N. Modiin (IL)

(73) Assignee: Ramot at Tel Aviv University Ltd., Tel Aviv (IL)

( * ) Notice: Subject to any disclaimer, the term of this patent is extended or adjusted under 35 U.S.C. 154(b) by 522 days.

(21) Appl. No.: 13/086,408

(22) Filed: Apr. 14, 2011

(65) Prior Publication Data

US 2011/0258370 A1   Oct. 20, 2011

Related U.S. Application Data

(60) Provisional application No. 61/324,380, filed on Apr. 15, 2010.

(51) Int. Cl.
*G06F 12/02* (2006.01)
*G11C 16/10* (2006.01)
*G11C 11/56* (2006.01)
*G11C 16/34* (2006.01)

(52) U.S. Cl.
CPC ............. *G11C 16/102* (2013.01); *G06F 12/02* (2013.01); *G11C 11/5628* (2013.01); *G11C 16/349* (2013.01)

(58) Field of Classification Search
CPC . G06F 11/1044; G06F 11/10; G06F 11/1068; G06F 11/1072; G06F 11/00; G06F 11/08; G06F 12/0246
USPC .............................. 711/103, E12.008, 15, 154
See application file for complete search history.

(56) References Cited

U.S. PATENT DOCUMENTS

| 5,867,641 | A | 2/1999 | Jenett |
| 5,936,884 | A | 8/1999 | Hasbun et al. |

(Continued)

FOREIGN PATENT DOCUMENTS

| EP | 0 770 959 A1 | 5/1997 |
| EP | 0 770 960 A1 | 5/1997 |

(Continued)

OTHER PUBLICATIONS

U.S. Appl. No. 61/136,234, filed Aug. 20, 2008.

(Continued)

*Primary Examiner* — Sanjiv Shah
*Assistant Examiner* — Edward Waddy, Jr.
(74) *Attorney, Agent, or Firm* — Alston & Bird LLP

(57) ABSTRACT

To store, successively, in a plurality of memory cells, first and second pluralities of input bits that are equal in number, a first transformation transforms the first input bits into a first plurality of transformed bits. A first portion of the cells is programmed to store the first transformed bits according to a mapping of bit sequences to cell levels, but, if the first transformation has a variable output length, only if there are few enough first transformed bits to fit in the first cell portion. Then, without erasing a second cell portion that includes the first portion, if respective levels of the cells of the second portion, that represent a second plurality of transformed bits obtained by a second transformation of the second input bits, according to the mapping, are accessible from the current cell levels, the second portion is so programmed to store the second transformed bits.

39 Claims, 11 Drawing Sheets

(56) References Cited

U.S. PATENT DOCUMENTS

| | | | |
|---|---|---|---|
| 6,014,724 A | 1/2000 | Jenett | |
| 6,088,264 A | 7/2000 | Hazen et al. | |
| 6,182,189 B1 | 1/2001 | Alexis et al. | |
| 6,195,288 B1 | 2/2001 | Fujio et al. | |
| 6,260,103 B1 | 7/2001 | Alexis et al. | |
| 6,279,133 B1* | 8/2001 | Vafai et al. | 714/763 |
| 6,304,657 B1* | 10/2001 | Yokota et al. | 380/28 |
| 6,378,037 B1 | 4/2002 | Hall | |
| 6,445,615 B2 | 9/2002 | Kobayashi et al. | |
| 6,667,903 B2 | 12/2003 | De Sandre et al. | |
| 6,714,452 B2 | 3/2004 | Kobayashi et al. | |
| 6,747,893 B2 | 6/2004 | Uribe et al. | |
| 6,760,805 B2 | 7/2004 | Lasser | |
| 6,809,962 B2 | 10/2004 | Uribe et al. | |
| 6,813,185 B2 | 11/2004 | Kobayashi et al. | |
| 6,829,168 B2* | 12/2004 | Micheloni et al. | 365/185.18 |
| 6,836,432 B1 | 12/2004 | Parker et al. | |
| 6,856,546 B2 | 2/2005 | Guterman et al. | |
| 6,970,971 B1* | 11/2005 | Warkhede et al. | 711/108 |
| 6,977,847 B2 | 12/2005 | Lasser et al. | |
| 7,046,548 B2 | 5/2006 | Cernea et al. | |
| 7,073,015 B2 | 7/2006 | Takai | |
| 7,088,615 B2 | 8/2006 | Guterman et al. | |
| 7,116,586 B2 | 10/2006 | Kobayashi et al. | |
| 7,359,244 B2 | 4/2008 | Kobayashi et al. | |
| 7,404,030 B2 | 7/2008 | Takai | |
| 7,484,158 B2 | 1/2009 | Sharon et al. | |
| 7,512,734 B2 | 3/2009 | Sutardja | |
| 7,518,922 B2 | 4/2009 | Maejima et al. | |
| 7,529,142 B2* | 5/2009 | Widdershoven | 365/200 |
| 7,617,359 B2 | 11/2009 | Sutardja et al. | |
| 7,634,615 B2 | 12/2009 | Sutardja | |
| 7,636,809 B2 | 12/2009 | Sutardja et al. | |
| 8,321,760 B2* | 11/2012 | Son et al. | 714/763 |
| 2001/0007533 A1 | 7/2001 | Kobayashi et al. | |
| 2002/0133742 A1 | 9/2002 | Hsu et al. | |
| 2002/0191442 A1 | 12/2002 | Kobayashi et al. | |
| 2003/0046484 A1 | 3/2003 | Lasser | |
| 2003/0046631 A1 | 3/2003 | Gappisch et al. | |
| 2003/0099134 A1 | 5/2003 | Lasser et al. | |
| 2004/0015079 A1 | 1/2004 | Berger et al. | |
| 2004/0109363 A1 | 6/2004 | Hamada | |
| 2004/0165450 A1 | 8/2004 | Kobayashi et al. | |
| 2004/0236901 A1* | 11/2004 | Briggs | 711/105 |
| 2004/0243879 A1 | 12/2004 | Hou et al. | |
| 2005/0057999 A1 | 3/2005 | Kobayashi et al. | |
| 2005/0086639 A1* | 4/2005 | Min et al. | 717/114 |
| 2005/0278559 A1 | 12/2005 | Sutardja et al. | |
| 2005/0289361 A1 | 12/2005 | Sutardja | |
| 2006/0015677 A1* | 1/2006 | Gongwer et al. | 711/103 |
| 2006/0078206 A1* | 4/2006 | Mishima et al. | 382/209 |
| 2006/0085737 A1* | 4/2006 | Liu | 715/513 |
| 2006/0122819 A1* | 6/2006 | Carmel et al. | 703/21 |
| 2006/0170571 A1* | 8/2006 | Martinian et al. | 341/50 |
| 2006/0259802 A1 | 11/2006 | Sutardja | |
| 2006/0262609 A1 | 11/2006 | Kobayashi et al. | |
| 2006/0277360 A1 | 12/2006 | Sutardja et al. | |
| 2007/0083785 A1 | 4/2007 | Sutardja | |
| 2007/0094444 A1 | 4/2007 | Sutardja | |
| 2007/0162236 A1* | 7/2007 | Lamblin et al. | 702/20 |
| 2007/0220202 A1 | 9/2007 | Sutardja et al. | |
| 2007/0226409 A1 | 9/2007 | Sutardja et al. | |
| 2007/0280031 A1 | 12/2007 | Maejima et al. | |
| 2008/0031042 A1 | 2/2008 | Sharon | |
| 2008/0140921 A1 | 6/2008 | Sutardja et al. | |
| 2008/0158948 A1 | 7/2008 | Sharon et al. | |
| 2008/0168215 A1* | 7/2008 | Jiang et al. | 711/103 |
| 2008/0215798 A1 | 9/2008 | Sharon et al. | |
| 2008/0222357 A1 | 9/2008 | Sutardja et al. | |
| 2008/0222437 A1 | 9/2008 | Sutardja et al. | |
| 2008/0301373 A1 | 12/2008 | Harada et al. | |
| 2009/0003084 A1* | 1/2009 | Kim et al. | 365/185.29 |
| 2009/0019235 A1 | 1/2009 | Harada et al. | |
| 2009/0022309 A1* | 1/2009 | Vanstone et al. | 380/28 |
| 2009/0070746 A1 | 3/2009 | Dhurjati et al. | |
| 2009/0119444 A1* | 5/2009 | Davis | 711/103 |
| 2009/0150595 A1* | 6/2009 | Lavan | 711/103 |
| 2009/0164704 A1* | 6/2009 | Kanade et al. | 711/103 |
| 2009/0201725 A1* | 8/2009 | Chang et al. | 365/185.03 |
| 2009/0210612 A1 | 8/2009 | Nakanishi et al. | |
| 2009/0241006 A1* | 9/2009 | Liikanen et al. | 714/752 |
| 2009/0303792 A1* | 12/2009 | Ho et al. | 365/185.03 |
| 2009/0313425 A1 | 12/2009 | Futa et al. | |
| 2010/0070692 A1 | 3/2010 | Litsyn et al. | |
| 2010/0082885 A1 | 4/2010 | Litsyn et al. | |
| 2010/0122113 A1* | 5/2010 | Weingarten et al. | 714/5 |
| 2010/0146192 A1* | 6/2010 | Weingarten et al. | 711/103 |
| 2010/0293434 A1* | 11/2010 | Bueb et al. | 714/758 |
| 2011/0055474 A1* | 3/2011 | Resch | 711/114 |
| 2011/0138104 A1* | 6/2011 | Franceschini et al. | 711/103 |
| 2011/0138105 A1* | 6/2011 | Franceschini et al. | 711/103 |
| 2011/0153913 A1* | 6/2011 | Huang et al. | 711/103 |
| 2011/0208921 A1* | 8/2011 | Pohlack et al. | 711/147 |

FOREIGN PATENT DOCUMENTS

| | | |
|---|---|---|
| EP | 0 852 798 A1 | 7/1998 |
| EP | 1 605 455 A2 | 12/2005 |
| EP | 1 605 456 A2 | 12/2005 |
| EP | 1 447 811 B1 | 3/2009 |
| EP | 2 088 510 A2 | 8/2009 |
| WO | WO 97/12368 A1 | 4/1997 |
| WO | WO 03/021448 A1 | 3/2003 |
| WO | WO 03/079038 A2 | 9/2003 |
| WO | WO 2007/133646 A2 | 11/2007 |
| WO | WO 2007/133647 A2 | 11/2007 |
| WO | WO 2008/103359 A1 | 8/2008 |
| WO | WO 2009/095902 A2 | 8/2009 |

OTHER PUBLICATIONS

R.L. Rivest, A. Shamir; "How to Reuse a 'Write-Once' Memory"; Information and Control; vol. 55, Nos. 1-3, Oct./Nov./Dec. 1982; pp. 1-19.

A. Jiang, V. Bohossian, and J. Bruck; "Floating Codes for Joint Information Storage in Write Asymmetric Memories"; Proc. International Symposium on Information Theory, pp. 1166-1170; 2007.

Fang-Wei Fu and A.J. Han Vinck; "On the Capacity of Generalized Write-Once Memory with State Transitions Described by an Arbitrary Directed Acyclic Graph"; IEEE Transactions on Information Theory; vol. 45, No. 1; Jan. 1999; pp. 308-313.

International Search Report from International Patent Application No. PCT/IB2011/051613, mailed Jul. 25, 2011.

* cited by examiner $H_{k \times n} \cdot C_2\ _{n \times 1} = I_2\ _{k \times 1}$

MULTIPLE PROGRAMMING OF FLASH MEMORY WITHOUT ERASE

This patent application claims the benefit of U.S. Provisional Patent Application No. 61/324,380, filed Apr. 15, 2010

FIELD AND BACKGROUND OF THE INVENTION

The present invention relates to programming of flash memories and, more particularly, to a method of programming a flash memory twice or more without erasing the memory cells between programmings.

Flash memories are a popular storage medium used in many applications, such as PDA-s, Mobile-Phones, Digital Cameras, Digital Audio Players, flash disks, etc. The properties of flash memory, making it so popular, include the fact that flash memory is non-volatile, meaning that no power is needed to maintain the information stored in the memory. In addition, flash memory offers fast read access times. Another feature of flash memory is that when packaged in a memory card, it is enormously durable, being able to withstand intense pressure, extremes of temperature, and even immersion in water.

Flash memories can be written and erased multiple times. (For historical reasons, writing to a flash memory often is called "programming" the flash memory. The terms "programming" and "writing" are used interchangeably herein.) However, the performance of a flash memory degrades as a function of the number of write erase cycles of the device. As the size of the feature of the integrated circuits that constitute a flash memory become increasingly smaller, the limitation on the number of erase cycles that a flash memory can tolerate before it starts to become unreliable becomes more and more severe and may fall to ~$10^2$-$10^4$ erase cycles. In a modern environment, with ever increasing use of high bandwidth data, the number of write erase cycles of a device is a real limitation on its expected life time.

A flash memory system that is capable of withstanding a larger number of write-erase cycles before its performance degrades would have significant advantages over conventional flash memory systems.

A naive way of extending the write-erase (W/E) cycles of a flash memory may be achieved by adding cells. Increasing the number of Word Lines (WL) or cells by a factor of 't' reduces the number of W/E cycles by a factor of 't' for programming the same amount of information. But this is a very inefficient solution.

A more attractive solution is to devise a method that allows several programming cycles of a page of a flash memory before the page is erased. One conventional solution is as follows, for a single bit per cell flash memory (usually referred to misleadingly as a "Single Level Cell", or "SLC" flash memory) in which an erased cell represents a "1" bit and a programmed cell represents a "0" bit.

The encoding of the input data for the first programming cycle is given by:

TABLE 1

| Information | Code |
|---|---|
| 00 | 011 |
| 01 | 101 |
| 10 | 110 |
| 11 | 111 |

For example, the two input bits "00" are represented in the flash memory by three cells programmed to store the value "011". The encoding for the second programming cycle is given by the matrix depicted in the following table:

TABLE 2

| | Code in first programming | | | |
|---|---|---|---|---|
| Information | 011 | 101 | 110 | 111 |
| 00 | 011 | 100 | 100 | 100 |
| 01 | 010 | 101 | 010 | 010 |
| 10 | 001 | 001 | 110 | 001 |
| 11 | 000 | 000 | 000 | 111 |

For each set of two new information bits and three bits already programmed in the three cells, Table 2 provides a new value for the three cells. The transition is made such that each cell can move from erase state "1" to programmed state "0" from the bits of the first programming operation but not the other way around, i.e., setting a programmed cell that stores "0" to an erased cell that stores "1". For example, if the three cells store the value "110" and it is desired to program the information sequence "01" then the value to store in the three cells should be "010", which means that the first cell is programmed to store "0" and the other two cells remain in their states as programmed in the first programming cycle.

It is quite simple to implement a short code with this scheme. The overhead (defined below) of this code is 50%. To decrease the number of flash cells needed to store the input data, it would be highly advantageous to have a similar scheme that has less overhead.

SUMMARY OF THE INVENTION

Such schemes are described below. Specific examples are provided for the case of two programming cycles before erase, though the described methods can be generalized and applied to larger number of programming cycles before erase as well.

The general scheme for a two programming cycles approach is:

First programming cycle:

Program the page with a codeword $C_1$ in which the probability for '0' (high state) is p, where p<½. This approach requires mapping from information bits to codewords of expected weight np, where n is the codeword length.

Second programming cycle:

In the second programming phase, the same page is programmed with a codeword $C_2$, such that bits which are '0' in $C_1$ are also '0' in $C_2$. Hence, we only increase the cell's threshold voltage, and avoid erasing cells. This approach requires using a code in which every information sequence has several codeword representations such that at least one representation satisfies the requirement that $C_2$ "covers" the '0'-s of $C_1$. When dealing with linear codes, such a code can be implemented using a "coset" code.

Therefore, one embodiment provided herein is a method of attempting to store, successively, in a plurality of memory cells, a first plurality of input bits and a second plurality of input bits, including: (a) providing a mapping of bit sequences to cell levels of the memory cells; (b) transforming the first plurality of input bits to a first plurality of transformed bits, using a first transformation; (c) programming at least a first portion of the memory cells to store the first plurality of transformed bits according to the mapping; and (d) subsequent to the programming of the at least first portion of the memory cells, and without erasing at least a second portion of the memory cells that includes the at least first portion of the memory cells: (i) determining, for the at least second portion of the memory cells, whether respective levels, of the at least second portion of the memory cells, that represent, according to the mapping, a second plurality of transformed bits obtained by transforming the second plurality of input bits using a second transformation, are accessible from the current respective cell levels of the second at least portion of the memory cells, and (ii) only if the respective levels, of the second at least portion of the memory cells, that represent, according to the mapping, the second plurality of transformed bits obtained by transforming the second plurality of input bits using the second transformation, are accessible from the current respective cell levels of the at least second portion of the memory cells: programming the at least second portion of the memory cells to store the second plurality of transformed bits according to the mapping.

Another embodiment provided herein is a memory device including: (a) a plurality of memory cells; and (b) a controller operative to attempt to store, successively, in the plurality of memory cells, a first plurality of input bits and a second plurality of input bits, by: (i) transforming the first plurality of input bits to a first plurality of transformed bits, using a first transformation, (ii) programming at least a first portion of the memory cells to store the first plurality of transformed bits according to a mapping of bit sequences to cell levels of the memory cells, and (iii) subsequent to the programming of the at least first portion of the memory cells, and without erasing at least a second portion of the memory cells that includes the at least first portion of the memory cells: (A) determining, for the at least second portion of the memory cells, whether respective levels, of the at least second portion of the memory cells, that represent, according to the mapping, a second plurality of transformed bits obtained by transforming the second plurality of input bits using a second transformation, are accessible from the current respective cell levels of the second at least portion of the memory cells, and (B) only if the respective levels, of the second at least portion of the memory cells, that represent, according to the mapping, the second plurality of transformed bits obtained by transforming the second plurality of input bits using the second transformation, are accessible from the current respective cell levels of the at least second portion of the memory cells: programming the at least second portion of the memory cells to store the second plurality of transformed bits according to the mapping.

Another embodiment provided herein is a system for storing input bits, including: (a) a memory device that includes a plurality of memory cells; and (b) a processor operative to attempt to store, successively, in the plurality of memory cells, a first plurality of the input bits and a second plurality of the input bits, by: (i) transforming the first plurality of the input bits to a first plurality of transformed bits, using a first transformation, (ii) programming at least a first portion of the memory cells to store the first plurality of transformed bits according to a mapping of bit sequences to cell levels of the memory cells, and (iii) subsequent to the programming of the at least first portion of the memory cells, and without erasing at least a second portion of the memory cells that includes the at least first portion of the memory cells: (A) determining, for the at least second portion of the memory cells, whether respective levels, of the at least second portion of the memory cells, that represent, according to the mapping, a second plurality of transformed bits obtained by transforming the second plurality of the input bits using a second transformation, are accessible from the current respective cell levels of the second at least portion of the memory cells, and (B) only if the respective levels, of the second at least portion of the memory cells, that represent, according to the mapping, the second plurality of transformed bits obtained by transforming the second plurality of the input bits using the second transformation, are accessible from the current respective cell levels of the at least second portion of the memory cells: programming the at least second portion of the memory cells to store the second plurality of transformed bits according to the mapping.

Another embodiment provided herein is a computer-readable storage medium having computer-readable code embodied in the computer-readable storage medium, the computer-readable code for storing input bits in a plurality of memory cells, the computer-readable code including program code for attempting to store, successively, in the plurality of memory cells, a first plurality of the input bits and a second plurality of the input bits, by: (a) transforming the first plurality of the input bits to a first plurality of transformed bits, using a first transformation; (b) programming at least a first portion of the memory cells to store the first plurality of transformed bits according to a mapping of bit sequences to cell levels of the memory cells; and (c) subsequent to the programming of the at least first portion of the memory cells, and without erasing at least a second portion of the memory cells that includes the at least first portion of the memory cells: (i) determining, for the at least second portion of the memory cells, whether respective levels, of the at least second portion of the memory cells, that represent, according to the mapping, a second plurality of transformed bits obtained by transforming the second plurality of the input bits using a second transformation, are accessible from the current respective cell levels of the second at least portion of the memory cells, and (ii) only if the respective levels, of the second at least portion of the memory cells, that represent, according to the mapping, the second plurality of transformed bits obtained by transforming the second plurality of the input bits using the second transformation, are accessible from the current respective cell levels of the at least second portion of the memory cells: programming the at least second portion of the memory cells to store the second plurality of transformed bits according to the mapping.

Another embodiment provided herein is a method of attempting to store, successively, in a plurality of memory cells, a first plurality of input bits and a second plurality of input bits, including: (a) providing a mapping of bit sequences to cell levels of the memory cells; (b) transforming the first plurality of input bits to a first plurality of transformed bits, using a first transformation that has a variable output length; (c) determining whether the first plurality of transformed bits is sufficiently small in number for at least a first portion of the memory cells to be programmed to store the first plurality of transformed bits according to the mapping; and (d) only if the first plurality of transformed bits is sufficiently small in number for the at least first portion of the memory cells to be programmed to store the first plurality of transformed bits according to the mapping: (i) programming the at least first portion of the memory cells to store the first plurality of transformed bits according to the mapping, (ii) transforming the second plurality of input bits to a second plurality of transformed bits, using a second transformation such that, for at least a second portion of the memory cells that includes the at least first portion of the memory cells, respective cell levels of the at least second portion of the memory cells that represent the second plurality of transformed bits according to the mapping are accessible from the current respective cell levels of the second at least portion of the memory cells, and (iii) programming the at least second portion of the memory cells to store the second plurality of transformed bits according to the mapping without erasing the second at least portion of the memory cells between the programming of the at least first portion of the memory cells to store the first plurality of transformed bits and the programming of the at least second portion of the memory cells to store the second plurality of transformed bits.

Another embodiment provided herein is a memory device including: (a) a plurality of memory cells; and (b) a controller operative to attempt to store, successively, in the plurality of memory cells, a first plurality of input bits and a second plurality of input bits, by: (i) transforming the first plurality of input bits to a first plurality of transformed bits, using a first transformation that has a variable output length, (ii) determining whether the first plurality of transformed bits is sufficiently small in number for at least a first portion of the memory cells to be programmed to store the first plurality of transformed bits according to a mapping of bit sequences to cell levels of the memory cells, and (iii) only if the first plurality of transformed bits is sufficiently small in number for the at least first portion of the memory cells to be programmed to store the first plurality of transformed bits according to the mapping: (A) programming the at least first portion of the memory cells to store the first plurality of transformed bits according to the mapping, (B) transforming the second plurality of input bits to a second plurality of transformed bits, using a second transformation such that, for at least a second portion of the memory cells that includes the first portion of the memory cells, respective cell levels of the at least second portion of transformed bits according to the mapping are accessible from the current respective levels of the second at least portion of the memory cells, and (C) programming the at least second portion of the memory cells to store the second plurality of transformed bits according to the mapping without erasing the second at least portion of the memory cells between the programming of the at least first portion of the memory cells to store the first plurality of transformed bits and the programming of the at least second portion of the memory cells to store the second plurality of transformed bits.

Another embodiment provided herein is a system for storing input bits, including: (a) a memory device that includes a plurality of memory cells; and (b) a processor operative to attempt to store, successively, in the plurality of memory cells, a first plurality of the input bits and a second plurality of the input bits, by: (i) transforming the first plurality of the input bits to a first plurality of transformed bits, using a first transformation that has a variable output length, (ii) determining whether the first plurality of transformed bits is sufficiently small in number for at least a first portion of the memory cells to be programmed to store the first plurality of transformed bits according to a mapping of bit sequences to cell levels of the memory cells, and (iii) only if the first plurality of transformed bits is sufficiently small in number for the at least first portion of the memory cells to be programmed to store the first plurality of transformed bits according to the mapping: (A) programming the at least first portion of the memory cells to store the first plurality of transformed bits according to the mapping, (B) transforming the second plurality of the input bits to a second plurality of transformed bits, using a second transformation such that, for at least a second portion of the memory cells that includes the first portion of the memory cells, respective cell levels of the at least second portion of transformed bits according to the mapping are accessible from the current respective levels of the second at least portion of the memory cells, and (C) programming the at least second portion of the memory cells to store the second plurality of transformed bits according to the mapping without erasing the second at least portion of the memory cells between the programming of the at least first portion of the memory cells to store the first plurality of transformed bits and the programming of the at least second portion of the memory cells to store the second plurality of transformed bits.

Another embodiment provided herein is a computer-readable storage medium having computer-readable code embodied in the computer-readable storage medium, the computer-readable code for storing input bits in a plurality of memory cells, the computer-readable code including program code for attempting to store, successively, in the plurality of memory cells, a first plurality of the input bits and a second plurality of the input bits, by: (a) transforming the first plurality of input bits to a first plurality of transformed bits, using a first transformation that has a variable output length; (b) determining whether the first plurality of transformed bits is sufficiently small in number for at least a first portion of the memory cells to be programmed to store the first plurality of transformed bits according to a mapping of bit sequences to cell levels of the memory cells; and (c) only if the first plurality of transformed bits is sufficiently small in number for the at least first portion of the memory cells to be programmed to store the first plurality of transformed bits according to the mapping: (i) programming the at least first portion of the memory cells to store the first plurality of transformed bits according to the mapping, (ii) transforming the second plurality of input bits to a second plurality of transformed bits, using a second transformation such that, for at least a second portion of the memory cells that includes the first portion of the memory cells, respective cell levels of the at least second portion of transformed bits according to the mapping are accessible from the current respective levels of the second at least portion of the memory cells, and (iii) programming the at least second portion of the memory cells to store the second plurality of transformed bits according to the mapping without erasing the second at least portion of the memory cells between the programming of the at least first portion of the memory cells to store the first plurality of transformed bits and the programming of the at least second portion of the memory cells to store the second plurality of transformed bits.

Disclosed herein are two methods for attempting to store, successively, in a plurality of memory cells, a first plurality of input bits and a second plurality of input bits. Normally, the second plurality of input bits is equal in number to the first plurality of input bits.

Both methods start by providing a mapping of bit sequences into cell levels of the memory cells. In the first basic method, the attempt to store the second plurality of memory bits may fail. In the second basic method, the attempt to store the first plurality of memory bits may fail.

In the first basic method, the first plurality of input bits is transformed to a first plurality of transformed bits, using a first transformation. In principle, the first transformation could be an identity transformation, but it is preferable for the first transformation to have a downward bias relative to the mapping: programming the transformed bits according to the mapping results in, overall, the programmed cells being in lower levels than if the input bits had been programmed directly according to the mapping. At least a first portion of the memory cells are programmed to store the first plurality of transformed bits according to the mapping. Subsequent to the programming of the at least first portion of the memory cells to store the first plurality of transformed bits, and without erasing at least a second portion of the memory cells that includes the at least first portion of the memory cells, a determination is made about the at least second portion of memory cells, relative to a second plurality of transformed bits that are obtained by transforming the second plurality of input bits using a second transformation. In principle the second transformation could be an identity transformation, but the preferred transformation is coset encoding. The determination is whether respective levels, of the cells of the at least second portion, that would represent the second plurality of transformed bits according to the mapping, are accessible from the current respective levels of the cells of the second at least portion. Only if the determination is positive is the at least second portion programmed to store the second plurality of transformed bits according to the mapping.

Most preferably, the first transformation is biased downward towards the lower half of the cell levels: programming the transformed bits according to the mapping results in more of the programmed cells being in the lower half of the programming levels than in the upper half of the programming levels.

The first transformation could be either a variable-output-length transformation or a fixed-output-length transformation. For different bit sequences of equal length input to a variable-output-length transformation, the number of bits in the output of the transformation changes, depending on the values of the bits input to the transformation. For bit sequences of equal sequence length input to a fixed-output-length transformation, all the output sequences have the same output sequence length (which, in the present context, is greater than the input sequence length). One preferred variable-output-length transformation is variable-length prefix encoding of the first plurality of input bits, for example, reverse Huffman encoding of the first plurality of input bits or reverse arithmetic encoding of the first plurality of input bits. Note that many variable-output-length transformations are not guaranteed to succeed. For example, a variable-length prefix encoding fails if the encoding produces more transformed bits than can be stored in the available memory cells. Some variable-output-length transformations, whose output lengths for a given input length can be constrained to differ by only a small number of bits, can be guaranteed to succeed without a significant penalty on the efficiency of the method by making sure that enough memory cells are available for the longest expected outputs. Preferred deterministic transformations include trellis encoding of the first plurality of input bits, reverse enumerative source encoding of the first plurality of input bits and encodings of the first plurality of input bits that are based on non-bijective mappings.

If each memory cell has more than two cell levels, then preferably if the first transformation includes variable-length prefix encoding of the first plurality of input bits then the variable-length prefix encoding is designed to induce a predefined probability distribution over the cell levels. Most preferably, the predefined probability distribution is optimized relative to the number of redundancy bits per constrained cell for the programming of the at least second portion of the memory cells. Equation (11) below presents this number of redundancy bits per cell as $$R = \sum_i p_i c_i.$$

Alternatively, the number of redundancy bits per constrained cell for the programming of the at least second portion of the memory cells is chosen in accordance with the predefined probability distribution. Also most preferably, each memory cell has at least eight cell levels and the programming of the at least second portion of the memory cells requires an overhead of at most about 27%.

Preferably, before the at least first portion of the memory cells is programmed to store the first plurality of transformed bits according to the mapping, the at least first portion of the memory cells is erased.

Preferred modes of coset encoding for the second transformation include algebraic coset encoding of the second plurality of input bits and erasure coset encoding of the second plurality of input bits to produce an erasure coset codeword. The erasure coset encoding could be subject to either hard constraints on the second plurality of transformed bits or soft constraints on the second plurality of transformed bits. Most preferably, the erasure coset encoding is iterative. Also most preferably, if the second transformation includes erasure encoding, the second transformation also includes finding one or more error correction redundancy bits such that error correction decoding of a combination (usually a concatenation) of the erasure coset codeword and the error correction redundancy bit(s), followed by erasure coset decoding of the results of the error correction decoding, reproduces the second plurality of input bits.

Preferably, if it is determined that respective levels, of the at least second portion of the memory cells, that represent the second plurality of transformed bits according to the mapping are in fact not accessible from the current respective levels of the second at least portion of the memory cells, then the second at least portion of the memory cells is erased and then programmed to store the second plurality of input bits according to the mapping.

In the second basic method, the first plurality of input bits is transformed to a first plurality of transformed bits using a first transformation that has a variable output length. It is determined whether the first plurality of transformed bits is sufficiently small in number for at least a first portion of the memory cells to be programmed to store the first plurality of transformed bits according to the mapping. The rest of the steps of the second basic method are contingent on the first plurality of transformed bits being in fact sufficiently small in number for the at least first portion of the memory cells to be programmed to store the first plurality of transformed bits according to the mapping. These steps start with programming the at least first portion of the memory cells to store the first plurality of transformed bits according to the mapping. Then, the second plurality of input bits is transformed to a second plurality of transformed bits, using a second transformation such that, for at least a second portion of the memory cells that includes the at least first portion of the memory cells, respective cell levels of the at least second portion of the memory cells that represent the second plurality of transformed bits according to the mapping are accessible from the current respective cell levels of the second at least portion of the memory cells. In principle the second transformation could be an identity transformation, but the preferred transformation is coset encoding. Finally, the at least second portion of the memory cells is programmed to store the second plurality of transformed bits according to the mapping without erasing the second at least portion of the memory cells between the programming of the at least first portion of the memory cells to store the first plurality of transformed bits and the programming of the at least second portion of the memory cells to store the second plurality of transformed bits.

Preferably, the first transformation has a downward bias relative to the mapping: programming the transformed bits according to the mapping results in, overall, the programmed cells being in lower levels than if the input bits had been programmed directly according to the mapping. Most preferably, the first transformation is biased downward towards the lower half of the cell levels: programming the transformed bits according to the mapping results in more of the programmed cells being in the lower half of the programming levels than in the upper half of the programming levels.

Preferably, the first transformation includes a variable-length prefix encoding, such as a reverse Huffman encoding or a reverse arithmetic encoding, of the first plurality of input bits. Preferred modes of the coset encoding of the second transformation include algebraic coset encoding of the second plurality of input bits and erasure coset encoding of the second plurality of input bits.

As in the case of the first method, if each memory cell has more than two cell levels, then preferably if the first transformation includes variable-length prefix encoding of the first plurality of input bits then the variable-length prefix encoding is designed to induce a predefined probability distribution over the cell levels. Most preferably, the predefined probability distribution is optimized relative to the number of redundancy bits per constrained cell for the programming of the at least second portion of the memory cells. Alternatively, the number of redundancy bits per constrained cell for the programming of the at least second portion of the memory cells is chosen in accordance with the predefined probability distribution. Also most preferably, each memory cell has at least eight cell levels and the programming of the at least second portion of the memory cells requires an overhead of at most about 27%.

There are two preferred options of how to proceed if in fact the first plurality of transformed bits is too large in number for the at least first portion of the memory cells to be programmed to store the first plurality of transformed bits according to the mapping.

According to the first option, the first plurality of input bits is scrambled to provide a plurality of scrambled bits that then are transformed to a third plurality of transformed bits, using the first transformation. It is determined whether the third plurality of transformed bits is sufficiently small in number for at least a third portion of the memory cells to be programmed to store the third plurality of transformed bits according to the mapping. That the third plurality of transformed bits is in fact sufficiently small in number for the at least third portion of the memory cells to be programmed to store the third plurality of transformed bits according to the mapping would allow the method to continue to program the at least third portion of the memory cells to store the third plurality of memory bits according to the mapping, followed by transforming the second plurality of input bits into a fourth plurality of transformed bits and then programming a fourth at least portion of the memory cells that includes the third at least portion of the memory cells to store the fourth plurality of transformed bits according to the mapping without erasing the fourth at least portion of the memory cells between the programming of the at least third portion of the memory cells to store the third plurality of transformed bits and the programming of the at least fourth portion of the memory cells to store the fourth plurality of transformed bits.

According to the second option, if the first plurality of input bits is sufficiently small in number for at least a third portion of the memory cells to be programmed to store the first plurality of input bits according to the mapping, then the at least third portion of the memory cells is programmed to store the first plurality of input bits according to the mapping. That allows the method to continue by transforming the second plurality of input bits into a fourth plurality of transformed bits and then programming a fourth at least portion of the memory cells that includes the third at least portion of the memory cells to store the fourth plurality of transformed bits according to the mapping without erasing the fourth at least portion of the memory cells between the programming of the at least third portion of the memory cells to store the third plurality of transformed bits and the programming of the at least fourth portion of the memory cells to store the fourth plurality of transformed bits.

A memory device corresponding to one of the two disclosed methods includes a plurality of memory cells and a controller that is operative to attempt to store, successively, in the plurality of memory cells, a first plurality of input bits and a second plurality of input bits, according to the corresponding disclosed method.

A system for storing input bits and corresponding to one of the two disclosed methods includes a memory device that includes a plurality of memory cells and a processor that is operative to attempt to store, successively, in the plurality of memory cells, a first plurality of input bits and a second plurality of input bits, according to the corresponding disclosed method.

A computer-readable storage medium corresponding to one of the two disclosed methods has embodied thereon computer-readable code for attempting to store, successively, in a plurality of memory cells, a first plurality of input bits and a second plurality of input bits, according to the corresponding disclosed method.

BRIEF DESCRIPTION OF THE DRAWINGS

Various embodiments are herein described, by way of example only, with reference to the accompanying drawings, wherein:

Figure 3:
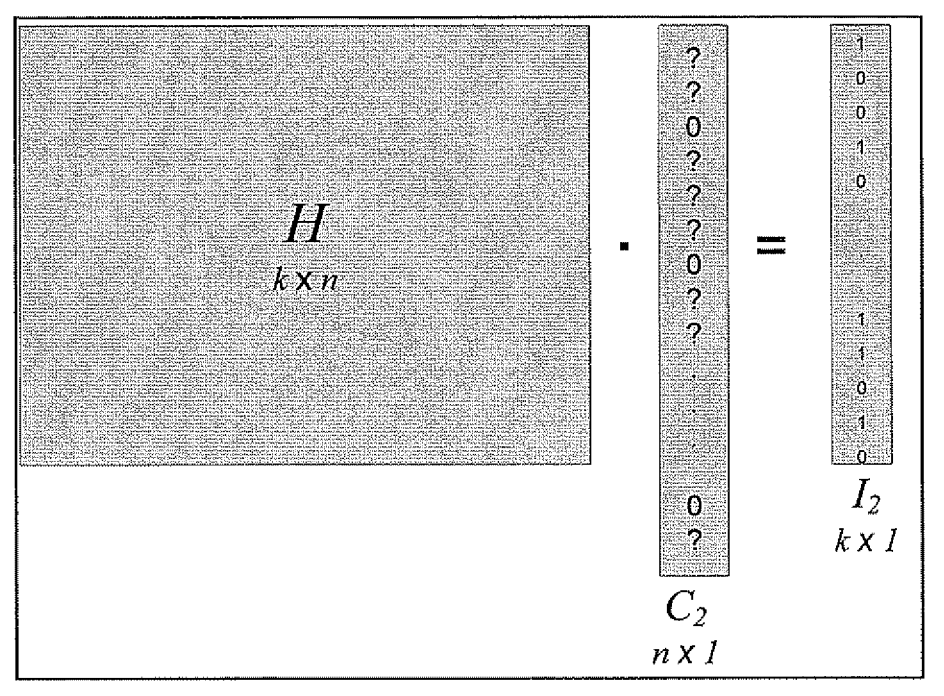

FIG. 3 illustrates erasure coset encoding;

FIGS. 6A-6C show the construction of the reverse Huffman tree of FIG. 6;

DESCRIPTION OF THE PREFERRED EMBODIMENTS

Figure 1:
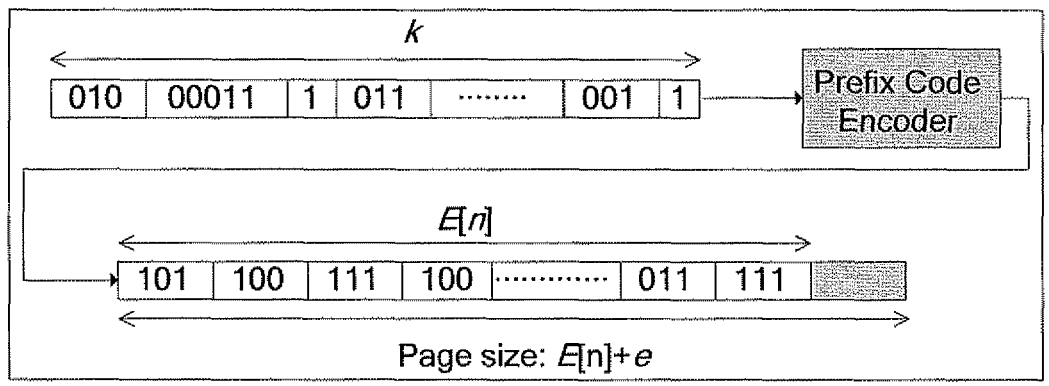
FIG. 1 illustrates prefix encoding.

The principles and operation of multiple programming of flash memory cells without intervening erasures may be better understood with reference to the drawings and the accompanying description.

We provide two separate solutions for each of the two programming cycles described above, followed by methods to retrieve the data in each of these solutions.

Programming twice without erase is not free! It costs overhead. For the case of SLC, and in the usual case of the same number of input bits being stored in both cycles, the theoretical bound is adding ~29.38% overhead to a SLC flash memory in order to be able to program the data twice before an erase operation is imposed. It can be shown that if different numbers of input bits are programed in the two cycles then the theoretical bound on overhead is slightly smaller. More specifically, assume the number of bits in the first programming is $k_1$ and the number of bits in the second programming is $k_2$. Then in the two programmings $k_1+k_2$ bits are programmed into n cells. If we limit ourselves to $k_1=k_2$, then we can achieve a ratio $(k_1+k_2)/n=2*k/n=1.5458$ which implies $n/k=1.2938$. However, without this limitation we can achieve a sligthly higher ratio $(k_1+k_2)/n=\log_2(3)=1.585$. The meaning of the ratio $(k_1+k_2)/n$ is the total number of bits that can be programmed during the two programming operations per cell.

A short derivation of this theoretical bound is as follows:

Let 'k' denote the number of information bits The number of codewords necessary for distinctly representing the 'k' bits is $2^k$. Assuming a codeword length of 'n' in which 'k' information bits are embedded, and further assuming that "legal" codewords are strings of 'n' bits containing at most np '0'-s (representing the programmed state in a flash memory device) for some fraction p<0.5, a first programming mapping dictates that:

$$2^k \leq \sum_{w=0}^{np} \binom{n}{w} \cong 2^{nH(p)} \quad (1)$$

where $H(p)=-p\log_2 p-(1-p)\log_2(1-p)$ and 'w' is the number of '0's in the 'n' bits.

The second programming dictates:

$$2^k \leq 2^{n-max\{w\}} = 2^{n(1-p)} \quad (2)$$

Here we take 'max{w}' since it is required that the amount of '1's in the 'n' bits, in the worst case scenario, is at least k. In other words, a codeword with the maximal number of '0' after the first programming cycle must still have 'k' '1's that could be programmed to any combination of 'k' bits.

Maximizing 'k' and optimizing on 'p' we get:

$$k = \max_p\{\min\{n \cdot H(p), n \cdot (1-p)\}\} = 0.7729 \cdot n \quad (3)$$

achieved at p=0.2271.

To summarize, an optimal scheme requires an overhead of about 30% extra cells, while allowing two programming cycles before erase. More precisely, $$\text{overhead} = \frac{n-k}{k} = \frac{p}{1-p} = 29.38\% \quad (4)$$

Alternatively, we can consider redundancy instead of overhead. The redundancy required by this scheme is given by:

$$\text{redundancy} = \frac{n-k}{n} = p = 22.71\%:$$

0.7729 information bits and 0.2271 redundant bits are stored per cell.

In order to approach thise theoretical limit of ~30% overhead, long codes are employed. Two non-trivial problems that need to be solved are:

1. How to implement the mapping required for the first programming cycle?

2. How to implement the coset coding scheme required for the second programming cycle?

Algorithms for the First Programming Cycle

The following paragraphs describe two algorithms for implementing the first programming cycle. The first solution is a probabilistic solution:

A variable length prefix code is used as the code for the first programming cycle. The prefix code is a variable length code that maps sequences of information bits to sequences of r bits, such that no sequence of information bits constitutes a prefix of another sequence.

The prefix code is designed to induce a non-uniform distribution, over the encoded sequence, having probability p for '0's and probability of 1–p for '1's, assuming that the probability for '0's and '1's in the information bits is ½. Note that the resulting code has variable length, but if the code is long enough its length is highly concentrated (e.g. very small variations) around k/H(p).

In a practical implementation we allocate slightly more storage space than the expected code length k/H(p). Thus, we can ensure that with high probability, the encoded codeword ($C_1$) can be stored in the allocated space. Referring now to the drawings, FIG. 1 illustrates such a prefix encoding scheme. In the low probability event that the code length is larger than the allocated space, we can either repeat the encoding after scrambling the information (if the original information had been scrambled before the first attempt at encoding, a new seed may be used in the second scrambling), resulting in a codeword $C_1$ with a different (hopefully shorter) length, or program the information sequence directly to the flash device (in this case the second programming cycle without erase usually will not be possible). "Scrambling" is an invertible transformation of an input bit sequence to an output bit sequence of the same length, such that each bit of the output bit sequence is a function of several bits of the input bit sequence and/or of an auxiliary bit sequence. "Scrambling" often is implemented using a linear feedback shift register that is initialized with a predefined seed to generate a "scrambling word" to be XOR-ed with the input bit sequence. (The seed is the auxiliary bit sequence.)

For example consider the following prefix code designed for r=3, and p=0.2271 [which is the optimal value according to the above equation (3)]. This prefix code is based on a reverse Huffman code. Consider sequences of r=3 bits in the encoded sequence. If indeed the probability of '0's in the encoded sequence is p=0.2271 then the probability for each encoded sequence is given in the following table:

TABLE 3

| Information | Probability |
|---|---|
| 111 | 0.4615 |
| 110 | 0.1357 |
| 101 | 0.1357 |
| 011 | 0.1357 |
| 100 | 0.0399 |
| 010 | 0.0399 |
| 001 | 0.0399 |
| 000 | 0.0117 |

Figure 2:
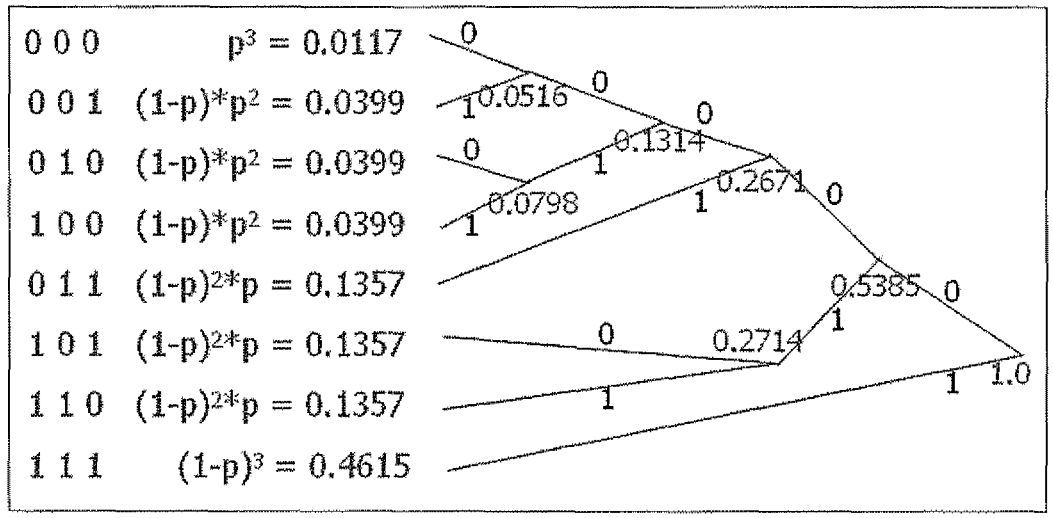
FIG. 2 shows a reverse Huffman tree for a specific prefix encoding.

Using Table 3 we can construct an Huffman code over an alphabet of size eight (000, 001, 010, 011, 100, 101, 110, 111) having the probabilities listed in Table 3. The resulting Huffman tree is shown in FIG. 2.

The Huffman tree defines the following mapping from information sequences into length r=3 encoded sequences:

TABLE 4

| Information | Code | Probability | Desired Probability |
|---|---|---|---|
| 1 | 111 | ½ = 0.5 | 0.4615 |
| 011 | 110 | ⅛ = 0.125 | 0.1357 |
| 010 | 101 | ⅛ = 0.125 | 0.1357 |
| 001 | 011 | ⅛ = 0.125 | 0.1357 |
| 00011 | 100 | 1/32 = 0.0313 | 0.0399 |
| 00010 | 010 | 1/32 = 0.0313 | 0.0399 |
| 00001 | 001 | 1/32 = 0.0313 | 0.0399 |
| 00000 | 000 | 1/32 = 0.0313 | 0.0117 |

The probabilities over the coded sequences that are induced by the mapping of Table 4 approximate the desired probabilities based on which the Huffman tree was constructed. Evidently according to Table 4 we can see that the actual probabilities do not exactly fit the desired ones and therefore some loss is expected. According to these induced probabilities, the expected code length would be 1.33 k (instead of the optimal 1.2938 k), where 'k' is the information length. This can easily be computed since for each triplet in the code the number of information bits 'k' which generated the triplet satisfy $E(k)=0.5+3\cdot3/8+5\cdot4/32=2.25$, so that $E(n k)=3/2.25=1.333$. The expected fraction of '0'-s in the code is p=0.2188 ($p=1/8+9/32\cdot1/3$). Hence, this construction gives a code which is quite close to the optimal code.

A similar construction for r=7 (alphabet of size 128) yields an expected code length of 1.3 k, and an expected fraction of '0'-s of 0.2291 which is very close to the optimal value of 0.2271. As we increase 'r' we can get as close as desired to the optimal probability, however even with r=7 the practical implementation loss is negligible.

As this solution is a probabilistic solution, there is a possibility of failing in the programming. In case of failure, premature erasure is required. We can make the probability of failure arbitrarily small (though it will affect the gap from capacity).

Alternative probabilistic encodings, based on methods known in the field of data compression, include reverse arithmetic coding.

Another option for performing the first stage encoding is the following deterministic method that is based on enumerative source encoding. Suppose 'k' information bits are to be programmed into 'n' binary cells with at most 't' cells programmed into the '0' state in any code word. Then the set k, n, t must satisfy:

$$2^k \leq \sum_{i=0}^{t} \binom{n}{i} \quad (5)$$

A mapping table maps between the information bits and the codewords, by assigning the location of the '0'-s in the codeword to each information vector.

This process can be simplified and implemented with reduced complexity, by partitioning the mapping table that maps the information bits to codewords.

For example, consider the following code with k=21, n=29, t=7. This triplet satisfies equation (5), since $$2,097,152 = 2^{21} \leq \sum_{i=0}^{7} \binom{29}{i} = 2,182,396 \quad (6)$$

However, a mapping that directly maps each information vector to a codeword is quite complex. The following is an example of an efficient way of encoding, which is both fast and requires only minimal memory resources. Generalizing this example to other values of n, k and t is straightforward.

First, the codewords of 29 bits are partitioned into two sections: 14 bits (MSB-s) and 15 bits (LSB-s).

Next, consider the following table enumerating the possible number of codewords of length 29 containing at most 7 '0'—s, where $w_1$ is the exact number of '0'-s in the first 14 bits of the codeword and 'z' is the number of codewords in the next 15 bits holding at most 7-$w_1$ number of '0'.

TABLE 5

| $w_1$ | $\binom{14}{w_1}$ | $z = \sum_{j=0}^{7-w_1} \binom{15}{j}$ | Exactly $w_1$ '0'-s in first 14 bits | At most $w_1$ '0'-s in first 14 bits |
|---|---|---|---|---|
| 0 | 1 | 16,384 | 16,384 | 16,384 |
| 1 | 14 | 9,949 | 139,286 = 9,949 × 14 | 155,670 = 139,286 + 16,384 |
| 2 | 91 | 4,944 | 449,904 = 4944 × 91 | 605,574 = 449,904 + 155,670 |
| 3 | 364 | 1,941 | 706,524 = 1,941 × 364 | 1,312,098 = 706,524 + 605,574 |
| 4 | 1,001 | 576 | 576,576 = 576 × 1,001 | 1,888,674 = 576,576 + 1,312,098 |
| 5 | 2,002 | 121 | 242,242 = 121 × 2,002 | 2,130,916 = +1,888,674242,242 |
| 6 | 3,003 | 16 | 48,048 = 16 × 3,003 | 2,178,964 = 48,048 + 2,130,916 |
| 7 | 3,432 | 1 | 3,432 | 2,182,396 = 3,432 + 2,178,964 |

For each value of $w_1$, there are $$\binom{14}{w_1}$$

possibilities for having exactly $w_1$ '0'-s in the first fourteen bits of the codeword. To each such option may be appended a vector of fifteen bits that contains at most 7-$w_1$ '0'-s. The number of such vectors of fifteen bits is $$\binom{14}{w_1} \cdot \sum_{j=0}^{7-w_1} \binom{15}{j},$$

and the total number of codewords containing at most seven '0'-s, and containing at most $w_1$ '0'-s in the first fourteen bits is therefore as provided in the rightmost column of Table-5:

$$\sum_{i=0}^{w_1} \binom{14}{i} \cdot \left[ \sum_{j=0}^{7-i} \binom{15}{j} \right]$$

The encoding/decoding may be implemented using two small tables. The first table has 9908=1+14+91+364+1001+

2002+3003+3432 entries; this table is associated with the first fourteen bits of the codeword, so each entry is fourteen bits long. The first entry of the table corresponds to no '0'-s in the first fourteen bits (and is "11111111111111"), the next fourteen entries correspond to one '0' in the first fourteen bits (and are "01111111111111" through "11111111111110", and the last 3432 entries correspond to seven '0'-s in the first fourteen bits (and are "00000001111111" through "11111110000000"). Each table entry includes fourteen bits with that corresponding $w_1$ '0'-s out of the fourteen bits.

A second table has 33932=16384+9949+4944+1941+576+121+16+1 entries, and this table is associated with the last fifteen bits of the codeword. The first 16,384 entries correspond to the $$\sum_{j=0}^{7}\binom{15}{j}=16{,}384$$

fifteen-bit codewords that have no '0'-s in the first fourteen bits, and have between 0 and seven '0'-s in the last fifteen bits, the next 9,949 entries correspond to all the $$\sum_{j=0}^{6}\binom{15}{j}=9{,}949$$

codewords that have one '0' in the first fourteen bits, and have between 0 and six '0'-s in the last 15 fifteen, and the last entry corresponds to the single possibility of having no '0'-s in the last fifteen bits, i.e., "111111111111111". For example consider the encoding of x="010010010011111000000", which is 600,000 in decimal. Since 155,670≤x≤605,574, x is encoded with two '0'-s in the first fourteen bits.

The position of x relative to all codewords with two '0'-s in the first fourteen bits is 600,000−155,670=444,330.

For each option containing two '0'-s in the first fourteen bits there are 4,944 options for the fifteen bit complement. Dividing 444,330 by 4,944, (with remainder) we get: 444,330=89×4,944+4314.

Therefore, in order to encode x:

take, as the first fourteen bits, entry 1+14+89 of the first lookup table;

take as the last fifteen bits, entry 16,384+9,949+4,314 of the second lookup table.

The lookup table for the first fourteen bits requires a total of 9,908 entries, while the complement fifteen bits require a lookup table of 33,932 entries for a total of 43,840 entries. A sixteen-bit lookup table is sufficient for the encoding/decoding. Note that using this method we can concatenate more tables of smaller size thus reducing the total memory size required to hold the tables.

Reconstructing 'x' from its encoded version requires either search on the table to find the offset of the value in each of the above tables, thus building the total offset of the 29 information bits which construct the code, or alternatively building a reverse table as well by only double the amount of memory size to reconstruct the offset of the value in each table. Note that the reverse tables' entries are not increasing by '1' therefore a search using a 'lion in the desert' method would require complexity of the log of the number of entries since the entries are kept sorted.

To continue the above example, to decode the codeword to recover 'x', if we have $y_1$=104 as the offset of the first fourteen bits of the codeword in the first table and $y_2$=4314 as the offset of the last fifteen bits of the codeword in the second table then 'x' would be $(y_1-1-14)\times 4{,}944+16{,}384+139{,}286+y_2$=600,000, a decimal number that then is translated to binary to provide the original 21 information bits.

Alternative deterministic encodings, based on methods known in the field of communication, include shaping methods such as trellis shaping. Other alternative deterministic encodings, based on methods known in the field of data compression, include other data decompression methods based on reverse enumerative source coding.

Trellis shaping is known in the field of communication for constellation shaping. Trellis shaping maps binary information sequences into signal constellations, such that non-uniform probability is induced over the signal set. Such methods can be adapted to the encoding of the first programming cycle. For example, in the case of a SLC flash memory, the signal points are mapped back into binary sequences with unequal probability for "0" and "1" by assigning to each signal point a binary sequence.

In enumerative source coding, a binary source that outputs a binary sequence in which "0" bits appear with probability $p\ne 0.5$ is compressed into a binary sequence in which "0" bits appear with probability 0.5. Such encoding may be done in the opposite direction for the first programming cycle. We start with a compressed source of information (with probability 0.5 for "0" bits) and we then decompress the compressed information bits into a binary sequence with probability p<0.5 for "0" bits.

Algorithms for the Second Programming Cycle

One preferred coding scheme for the second programming cycle (i.e. the coding scheme used for encoding $C_2$) is to use a code in which every information sequence has several codeword representations such that at least one representation satisfies the requirement that all (or most) of its induced cell levels are accessible from the current cell levels of the cells that are to be re-programmed.

One such coding scheme uses a coset code, defined by a parity-check matrix H according to the following set of equations:

$$H\cdot C_2 = I_2 \qquad (7)$$

where $I_2$ is the information sequence to be programmed in the second programming cycle and $C_2$ is the codeword which is programmed in the second programming cycle. Some of the bits in the codeword $C_2$ are dictated as a result of the first programming cycle and cannot be chosen freely. A fraction 'p' of the bits that are to be stored in the same fraction p of cells that were programmed to "0" (high state) in the first programming cycle cannot be programmed to "1" (low state) in the second programming cycle (i.e. these bits are "stuck" at "0"), as the cell voltage can only be increased during programming. This means that the encoding procedure during the second programming cycle requires finding a codeword $C_2$ that satisfies Equation (7) but that also has some of its bits predetermined (set to "0") by the first programming cycle. The preferred way to implement such an encoding procedure is to use an "erasure" encoder for solving the system of equations (7), as illustrated in FIG. 3. The "?" entries in $C_2$ in FIG. 3 represent "erased" bits which can be either 0 or 1. The erasure encoder finds a valid assignment for the erased bits that satisfies Equation (7).

In order to efficiently perform the erasure encoding, the use of an iterative message-passing equation solver is preferred. In order for this to work properly, the parity-check matrix H that defines the coset code should be a sparse parity-check matrix, which is optimized for efficient correction of up to n×(1−p) erasures under iterative decoding. Designing such an optimized matrix H can be done using tools for designing capacity-approaching Low-Density Parity-Check (LDPC) codes for the erasure channel, as is known in the art of iterative error correction coding schemes.

Using an iterative encoder to solve the set of equations ensures linear encoding complexity. The iterative encoder for the erasure channel is very simple. The equations in (7) are traversed one after the other iteratively, and whenever an equation involving only a single erased bit is encountered, the value of the erased bit is set to satisfy the equation (and the bit is no longer erased). The encoding process ends if there are no more erased bits (i.e. if all the bits of $C_2$ are known) or if there are no more equations with only a single erased bit, which would mean that the encoding procedure is stuck and cannot converge.

Note that even when the decoder converges, it may be the case that not all the equations dictated by the matrix H are satisfied. In other words, there may be two (or more) different equations that include the same erased bit but do not agree on the sign of the bit: one of the equations is satisfied when the bit is "0" and the other equation is satisfied when the bit is "1". Such an event indicates that there is no solution for the set of equations satisfying all the initial constraints that were dictated by $C_1$.

Hence, failure to converge to a valid solution can be due to one of the following two reasons:
1. There might not be a solution to the set of equations for the initial set of '0'-s in $C_2$.
2. Even if there is a solution, the iterative solver is not guaranteed to converge (the iterative solver generally is suboptimal)

Careful design of H can ensure that the probability of not converging due to either of the above reasons can be arbitrarily small, and if the decoder fails to converge we can either repeat decoding with a different H, or declare failure, erase the page, and, following the erasure, program the page to store the input bits of the second cycle, for example using one of the algorithms of the first cycle.

Another option is to allow some of the programmed bits in $C_2$ to not satisfy constraints imposed by the first programming cycle. In this case, some of the cells programmed in the second programming cycle will be in error (e.g. a cell that should be programmed to "1" according to $C_2$, but cannot be programmed to '−1" because the cell was already programmed to "0" during the programming of $C_1$). As long as the number of such erroneous cells is kept sufficiently small this may be satisfactory, as the codes used for the first and second programming cycles ($C_1$ and $C_2$) are usually designed to support a certain error correction capability (ECC) (i.e. the codes also include ECC functionality) which will correct those bits when they are read. In case some errors are allowed in the programming of $C_2$, then an iterative encoding scheme that does not use "hard" constraints in the bits that are dictated by codeword $C_1$ can be implemented. In such an encoding scheme "soft" constraints are used. Such "soft" constraints can be represented by Log-Likelihood Ratios (LLRs) as explained below. Such "soft" constraints are used for indicating to the iterative encoder that it is preferred but not absolutely required that certain bits be set to "0". The iterative encoder is allowed to decide differently in case there is no valid solution. The iterative encoder tries to find a solution that satisfies most of the constraints, thus minimizing the initial error rate in $C_2$. To guarantee the convergence of the iterative encoder, a special lower triangular structure in the parity-check matrix H. This lower triangular matrix structure is illustrated in FIG. 4.

Figures 4, 5:
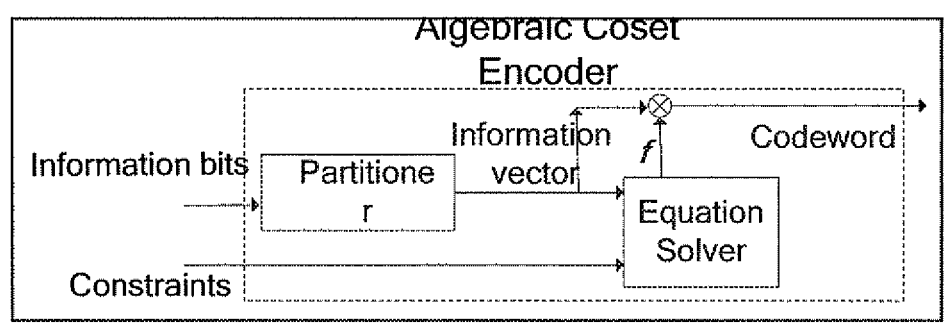
FIG. 4 illustrates a lower triangular matrix structure for guaranteeing convergence of erasure coset encoding.
FIG. 5 illustrates algebraic coset encoding.

The terminology used in FIG. 4 is as follows:
K—number of information bits.
$M_1$—number of redundancy bits added for allowing multiple codeword representations for every information vector (there are $2^{M_1}$ possible vectors C associated with each information vector I).
$M_2$—number of redundancy bits for conventional ECC.
The following is a K=4, $M_1$=2, $M_2$=0 example.

$$H = \begin{pmatrix} 1 & 1 & 1 & 0 & 0 & 0 \\ 1 & 0 & 1 & 1 & 0 & 0 \\ 1 & 1 & 0 & 1 & 1 & 0 \\ 0 & 0 & 1 & 1 & 0 & 1 \end{pmatrix}, I = \begin{pmatrix} 1 \\ 0 \\ 1 \\ 0 \end{pmatrix}$$

Assuming $C=(c_1, c_2, c_3, c_4, c_5, c_6)^T$ the general solution of HC=I is found by choosing $c_1$ and $c_2$ as parameters and expressing the other four elements of C as $c_3 = c_1 + c_2 + I_1$ $c_4 = c_2 + I_1 + I_2$ $c_5 = c_1 + I_1 + I_2 + I_3$ $c_6 = c_1 + I_2 + I_4$ One solution (default) is to choose $c_1 = c_2 = 0$ so that $c_3 = I_1 = 1$ $C_4 = I_1 + I_2 = 1$ $c_5 = I_1 + I_2 + I_3 = 0$ $c_6 = I_2 + I_4 = 0$ If the first programming cycle requires $c_3 = 0$, choose $c_1 = 0$ and $c_2 = 1$, so that $c_3 = c_2 + I_1 = 0$ $c_4 = c_2 + I_1 + I_2 = 0$ $c_5 = I_1 + I_2 + I_3 = 0$ $c_6 = I_2 + I_4 = 0$ Alternatively, setting $c_1 = 1$ and $c_2 = 0$ gives $c_3 = c_1 + I_1 = 0$ $c_4 = I_1 + I_2 = 1$ $c_5 = c_1 + I_1 + I_2 + I_3 = 1$ $c_6 = c_1 + I_2 + I_4 = 1$ As is conventional in iterative LDPC decoding, the bits of C can be represented as LLRs. The LLR representation of a bit v is a measure of the is probability of the bit being 0 or 1 as follows:

$$\log \frac{Pr(v=0 \mid \text{current constraints and observations})}{Pr(v=1 \mid \text{current constraints and observations})}$$

The matrix structure of FIG. 4 can guarantee that an iterative encoder always converges to a valid solution for C. This is done by performing an initial encoding operation, and in case the encoding does not converge (i.e. a codeword satisfying all the checks is not found), the first $M_1$ bits of C are modified in such a way that strengthens the "trend" of these bits, i.e. negative values of the first $M_1$ bits (negative LLRs and so tend to "1") are given higher probabilities of being 1 (larger negative values), and positive values of the first $M_1$ bits (positive LLRs and so tend to 0) are given higher probabilities of being 0 (large positive values). The encoding then is repeated.

This strategy guarantees that the encoding converges, since for specific values of the first $M_1$-1 bits there is a (unique) solution to the set of equations. From FIG. 4 it is clear that once the first $M_1$-1 bits are set, using Gaussian elimination in the next $K+M_2$ equations adds one more bit per equation whose value is defined by the corresponding matrix row (equation). For example, if $M_1=2$, $K=3$ and $M_2=0$, if the first two elements in the first row of H are 0 and 1, and if $I(1)=I(2)=1$, then setting $c_1=0$ implies $c_1=1$. Then if the second row of the matrix is (1 1 1) it follows that $c_1 \oplus c_2 \oplus c_3 = 0 \oplus 1 \oplus c_3 = I(2)=1$ so that $c_3=0$. ("$\oplus$" means addition modulo 2.)

Initially, the first $M_1$ bits are unbiased (LLR=0) in order to not enforce a solution. In practice, the iterative procedure is limited to a small number of iterations and the LLRs associated with the first $M_1$ bits are set and then the encoding continues with Gaussian elimination for the next $K+M_2-1$ steps. In each such step the single next bit of C is computed.

When the codeword is read back from the flash memory, conventional ECC, based on the matrix $H_{ECC}$, is used to recover the first $M_1+K$ bits of C, and those bits are multiplied by H to recover the information vector I. The $M_2$ ECC redundancy bits are an example of what is called "error correction redundancy bits" in the appended claims. C then is a concatenation of $K+M_1$ bits of an erasure coset codeword and the $M_2$ ECC redundancy bits. The multiplication of the first $M_1+K$ bits of C by H to recover I is an example of "erasure coset decoding".

Another preferred coding scheme for the second programming cycle is an algebraic coset coding scheme based on the Galois field $GF(2^{t+1})$.

$GF(2^{t+1})$ is a set of $2^{t+1}$ elements with well-defined operations of summation, multiplication and division. The elements in the field can be represented as binary vectors of length t+1 Alternatively, the field elements can be represented as binary polynomials of degree at most t with well-defined operations of summation, multiplication and division.

Each element of $GF(2^{t+1})$ is associated with a vector of t+1 coordinates and with a polynomial of degree at most t over GF(2) in the following manner:

$$a=(a_3,a_1,\ldots,a_t) \leftrightarrow p_a(x)=a_0+a_1x+\ldots+a_tx^t$$

The coefficients of the polynomial $p_a(x)$ are elements in GF(2) (i.e., either 0 or 1) and summation of $p_a(x)$ and $p_b(x)$ is defined as:

$$p_a(x)+p_b(x) = \sum_{j=0}^{t}(a_j \oplus b_j) \cdot x^j \bigg| a_b \oplus b_j = a+b \text{ modulo } 2$$

Multiplication of two elements, a,b is done by multiplication of the associated polynomials $p_a(x), p_b(x)$ and taking the result modulo a predefined irreducible polynomial g(x) of degree t+1 over GF(2). The multiplication result $a \cdot b$ can be represented as a binary vector of length t+1 over GF(2), where each coordinate is a binary linear combination of elements (coefficients) of a and elements (coefficients) of b.

To complete the picture, the inverse and the division operation are defined. Each non-zero element a of $GF(2^{t+1})$ has a unique inverse element denoted $a^{-1}$, such that $a \cdot a^{-1} = a^{-1} \cdot a = 1$. Division by a is equivalent to multiplication by $a^{-1}$.

Now, given an information vector I of length $K = k \times (t+1)$ over GF(2), (i.e. each coordinate of I is 0 or 1), and given a set of $(k+1) \times (t+1)$ binary cells containing at most 't' programmed cells, (i.e. cells that are already programmed to '0'), the information vector is partitioned into multiple segments $v_i$ that form a vector $I=(v_0, v_1, \ldots, v_{k-1}) \in GF(2^{t+1})^k$. Each of the segments $v_i$ is a vector of t+1 bits associated with an element of $GF(2^{t+1})$ in a standard manner. A family of multiple encodings, a set $\{(v_0 f, v_1 f, \ldots, v_{k-1}, f, f) | f \in GF(2^{t+1}), f \neq 0\}$, is associated with the information vector $I=(v_0, v_1, \ldots, v_{k-1})$. Thus we associate with each information vector I a family of $2^{t+1}-1$ encodings. Each encoding involves a different value of 'f'.

Choosing a specific encoding with at most 't' bits constrained to be 0 is translated, using basic linear algebra, to a set of at most 't' homogeneous equations with t+1 unknowns, where the unknowns are the coordinates of f. A non-trivial solution is guaranteed to exist, and can be computed by standard linear algebra means. One of the non-trivial solutions is chosen (via Gauss elimination procedure or otherwise), and f is constructed. Then the codeword vector $(v_0 f, v_1 f, \ldots, v_{k-1} f, f)$ is computed as the code-word corresponding to the constraints.

The decoding procedure is as follows. Given a received code-word $(w_0, w_1, \ldots, w_{k-1}, f)$, the decoded information vector is given by $I=(w_0 f^{-1}, w_1 f^{-1}, \ldots, w_{k-1} f^{-1})$. Note that because $f \neq 0$ and since $f \in GF(2^{t+1})$, it is guaranteed that $f^{-1}$ exists and that $f^{-1} \neq 0$.

Another algebraic encoding option is to encode $I=(v_0, v_1, \ldots, v_{k-1})$ as $(v_0 f, v_1 f, \ldots, v_{k-1} f, f^{-1})$. However, the constrained cells may be also in the last cells, which correspond to f and $f^1$ may not satisfy the constraints, therefore this option is viable only if there are no constraints for the last cells holding $f^1$. If there are one or more constraints for the last cells holding $f^1$, the page is erased and then programmed to store the input bits of the second cycle, for example using one of the algorithms of the first cycle, as in the case of failure of the erasure coset encoding.

The algebraic encoding process is illustrated in FIG. 5.

FIG. 5 shows a typical implementation of an algebraic coset encoder. The encoder includes a partitioner unit that partitions an incoming stream of data bits into vectors of information. Each information vector, together with the constraints, (which are read from the flash memory), is fed to an equation solver block. In the equation solver block a set of linear equations is generated and solved (non-trivial solution). The output of this unit is a field element f which is used for the coset encoding. The coset encoding is completed by multiplying the vector of information by f, (coordinate-wise), and concatenating f in order to generate the coset codeword.

The algebraic encoding scheme for the second programming cycle, as described so far, deals only with information words whose length is an integer multiple of t+1. For other lengths of information words we need a generalization of the scheme. The algebraic encoding scheme can be generalized to the following scheme.

Given an information vector 'I' of length 'K' over GF(2), (i.e. each coordinate of I is 0 or 1), and given a set of K+t+1 binary cells containing at most t constrained cells, (i.e. cells that already have been programmed to '0' in the first programming cycle), the information vector is partitioned in the form $I=(v_0, v_1, \ldots, v_{k-1})$.

In this case the different coordinates of I as partitioned in this manner may have different resolutions, (number of bits), subject to the constraint that the resolution of each coordinate, $r_i$, is at least t+1, and that $\Sigma_{i=0}^{k-1} r_i \geq K$, with the case of strict inequality corresponding to (zero) padding of one or more of the coordinates. Each of the coordinates $v_i$ is a vector of $r_i$ bits and is associated with an element of $GF(2^{r_i})$ in a standard way.

Each zero-padded term adds one or more constraints (the zero-padded coordinates of f must be zero) but also addes the same number of free variables, so that zero padding does not cause a change in whether a soulution exists. The designer must make sure that at least t+1 equations exist with no more than cells programmed to '0' in the first programming cycle.

The family of multiple encodings is the set $\{(v_0 f^{(0)}, v_1 f^{(1)}, \ldots, v_{k-1} f^{(k-1)}, f) | f \in GF(2^{r+1}), f \neq 0\}$. In this formula, each $f^{(i)}$ is a f padded with zeros to the resolution $r_i$. The constraint equations are formulated for each coordinate according to the specific field $GF(2^{r_i})$ associated with the specific coordinate.

For example, suppose nine information bits need to be written into thirteen cells with three cells already programmed to '0' in the first programming phase. The information bits are partitioned into a vector $I=(v_0, v_1)$, where $v_0$ has four coordinates and $v_1$ has five coordinates. The encoded vector takes the form $(v_0 f^{(0)}, v_1 f^{(1)}, f)$, with $f^{(0)}=f$, and $f^{(1)}=[f\ 0]$.

In order to compute the codeword and the constraints, we need to define generating polynomials for $GF(2^5)$ and $GF(2^4)$. For $GF(2^4)$, we choose the field generator polynomial $g_4(x)=1+x+x^4$. Therefore multiplication is defined by:

$$a = (a_0, a_1, a_2, a_3), b = (b_0, b_1, b_2, b_3) \quad (8)$$

$$ab = (a_0 b_0 + a_3 b_1 + a_2 b_2 + a_1 b_3,$$
$$a_1 b_0 + [a_0 + a_3]b_1 + [a_2 + a_3]b_2 + [a_1 + a_2]b_3,$$
$$a_2 b_0 + a_1 b_1 + [a_0 + a_3]b_2 + \{a_2 + a_3\}b_3,$$
$$a_3 b_0 + a_2 b_1 + a_1 b_2 + [a_0 + a_3]b_3)$$

For $GF(2^5)$, we choose the field generator polynomial $g_5(x)=1+x^2+x^5$. Therefore, multiplication is defined by:

$$a = (a_0, a_1, a_2, a_3, a_4), b = (b_0, b_1, b_2, b_3, b_4) \quad (9)$$

$$ab = (a_0 b_0 + a_4 b_1 + a_3 b_2 + a_2 b_3 + [a_1 + a_4]b_4,$$
$$a_1 b_0 + a_0 b_1 + a_4 b_2 + a_3 b_3 + a_2 b_4,$$
$$a_2 b_0 + [a_1 + a_4]b_1 + [a_0 + a_3]b_2 + [a_2 + a_4]b_3 + [a_1 + a_3 + a_4]b_4,$$
$$a_3 b_0 + a_2 b_1 + [a_1 + a_4]b_2 + [a_0 + a_3]b_3 + [a_2 + a_4]b_4,$$
$$a_4 b_0 + a_3 b_1 + a_2 b_2 + [a_1 + a_4]b_3 + [a_0 + a\ +]b_4)$$

Suppose the information vector I is the following nine bits of information: I=(110110101). Suppose further that the cells that are already programmed to 0 are cells 2, 7, and 11 (starting from 1) in the thirteen cells set for programming nine bits twice. Partitioning I into $I=(v_0,v_1)$, we have $v_0=(1, 1, 0, 0, 1)$, $v_1=(1, 0, 1, 0, 1)$. The constraint for the second bit being 0 translates to the following equation [taken from the definition over $GF(2^4)$]:

$$f_0 + f_2 + f_3 = 0$$

This equation is obtained by forcing the second term of equation (8), $a_1 b_0 + [a_0 + a_3]b_1 + [a_2 + a_3]b_2 + [a_1 + a_2]b_3$, to be zero, with $f_0=b_0$, $f_1=b_1$, $f_2=b_2$, $f_3=b_3$. $a=v_0$ means $a_0=1$, $a_1=1$, $a_2=0$, $a_3=1$.

The constraint for the seventh bit being 0 translates to the third bit of $v_1 f^{(1)}$ being 0. To satisfy this constraint we recall that $f^{(1)}=[f\ 0]=(f_0, f_1, f_2, f_3, 0)$, and then we get the following equation [taken from the definition over $GF(2^5)$]:

$$f_0 + f_1 + f_2 = 0$$

This equation is obtained by forcing the third term of equation (9), $a_2 b_0 + [a_1+a_4]b_1 + [a_0+a_3]b_2 [a_2+a_4]b_3 + [a_1+a_3+a_4]b_4$, to be zero while $b_0=f_0$, $b_1=f_1$, $b_2=f_2$, $b_3=f_3$, $b_4=0$. $a=v_1$ means $a_0=1$, $a_1=0$, $a_2=1$, $a_3=0$, $a_4=1$.

A third constraint is $f_1=0$ which follows directly from the eleventh cell being programmed to 0. All together, a non-zero solution is f=(1,0,1,0). Therefore, $v_0 f=(1,0,0,0)$, $v_1=(1,1,0,1,0)$, so that the transmitted codeword is:

$$(v_0 f, v_1 f, f) = (1,0,0,0,1,1,0,1,0,1,0,1,0)$$

Reconstructing the information is done via multiplication of all the partitions by $f^{-1}$. Unlike the erasure encoding example of FIG. 4, in the algebraic encoding case, ECC and coset encoding cannot be combined. The ECC scheme, which may be any conventional ECC scheme, is applied in the encoder after coset encoding and in the decoder before coset decoding. In this case the parity bits of the ECC cannot be constrained and it may be necessary to dedicate unprogrammed cells for storing the parity bits. If the required ECC redundancy is small, such use of dedicated unprogrammed cells incurs only a small penalty.

Another option for encoding the information vector I of the preceding example is to embed the nine-bit information vector into an element of $GF(2^9)$, $v_0$, and generate the constraint equations by studying the product $v0 f^{(0)}$ in $GF(2^9)$, but this would be more complex than the partitioning solution presented above.

Generalization to MLC Flash Memories

The examples presented above assume a storage device, such as a flash memory, whose memory cells have two levels, with the upper level associated with '0' and the lower level (generally the erase state) associated with '1'. This kind of flash memory is known as SLC (standing for Single Level Cell), flash memory. The following discussion presents several schemes that extend the above results and examples to so-called Multi-Level Cell (MLC) flash systems, in which each cell stores more than one bit.

One natural extension to MLC is to conceptually map each MLC cell into several SLC cells, and to apply the results of SLC. This is particularly simple when the number of levels of the MLC cell is an integer power of 2. Suppose each MLC cell has $2^l$ levels (states). There then is a natural mapping between n cells of MLC type flash and ni cells of SLC type flash. The methods presented above for programming twice into nl SLC cells without erasing can be directly applied to programming twice into n cells with $2^l$ levels per cell without erasing.

The concept of a "norm" is used in some of the following discussions.

The mathematical notion of the norm of a vector gives a formal meaning to the intuitively used concept of the magnitude of a vector.

In order for a function $\|x\|$ of a vector x to be a norm function it has to satisfy three properties (all very intuitive)

1. $\|x\| \geq 0$
2. $\|x\|$ is multiplicative: if a is a scalar then $\|ax\|=a\|x\|$
3. The triangle inequality: for any two vectors x and y, $\|x+y\| \leq \|x\|+\|y\|$ One popular set of norms is the p-norms, defined by $$\|x\|_p = \left(\sum_i |x_i|^p\right)^{1/p}$$

Popular special cases include the Euclidean norm (p=2), also known as the $L_2$ norm; the $L_1$ norm (p=1); and the $L_\infty$ norm (p=∞)

$$\|x\|_\infty = \max_i\{|x_i|\}.$$

The double programming procedure of an MLC flash memory follows the same general path as the double programming procedure of an SLC flash memory as described above.

The general scheme for a two-programming-cycles approach for a page of an MLC flash memory is therefore:

First Programming Cycle:

Program the page with a codeword $C_1$, such that the vector comprising the programming levels of the programmed cells according to $C_1$, satisfy some constraint. This constraint ensures that the programmed cells, (with a high probability), are able to be programmed at least once more without the need to reduce the voltage level of any of the programmed cells. The constraint may be:

a) The vector comprising the programming levels of the programmed cells according to $C_1$ has a norm that does not exceed a predefined number.

b) The vector comprising the programming levels of the programmed cells according to $C_1$ induces a predefined probability distribution P over the programmed levels. Note that a specific realization of $C_1$ may have an empirical distribution which is different from P. However, the expected distribution over all possible codewords $C_1$ is P.

c) The vector comprising the programming levels of the programmed cells according to $C_1$ has at most 't' cells that are programmed and all other cells are kept erased.

It now will be demonstrated how the predefined probability distribution of the second constraint can be obtained. Specifically, it will be demonstrated how uniformly distributed input data may be stored in a sufficiently large number of MLC flash cells with any desired probability distribution over the programmed levels (or, more accurately, how to approach the desired probability distribution with any desired degree of accuracy). In this context, that the input data are "uniformly distributed" means that the bit sequences, corresponding to the various levels to which the cells may be programmed, occur equally often in the input data. The specific mapping of bit sequences to programmed levels that is used in the following discussion is:

| Bit Sequence | Programmed Level |
|---|---|
| 0 0 | 0 |
| 0 1 | 1 |
| 1 1 | 2 |
| 1 0 | 3 |

That the input data are "uniformly distributed" means that the bit sequences "0 0", "0 1", "1 1" and "1 0" all occur equally often in the input data. The corresponding probability distribution vector P is (0.25, 0.25, 0.25, 0.25). It will be clear to those skilled in the art how to apply the technique to other mappings of bit sequences to programmed levels.

The heart of the technique is a reverse Huffman encoding of the input data bits as a string of transformed data bits. The transformed data bits are the bits that are actually programmed into the flash memory cells using the mapping of bit sequences to programmed levels. The reverse Huffman encoding is such that uniformly distributed input data bits are encoded as transformed data bits whose probability distribution approximates the desired probability distribution.

In the following example, the target probability distribution is (⅜, 5/16, 3/16, ⅛). A sequence of reverse Huffman encodings is constructed whose respective probability distributions converge to the target probability distribution. The n-th reverse Huffman encoding of the sequence uses n four-level flash cells. The construction stops at the value of n that provides a sufficiently close approximation to the target probability distribution.

Figure 6:
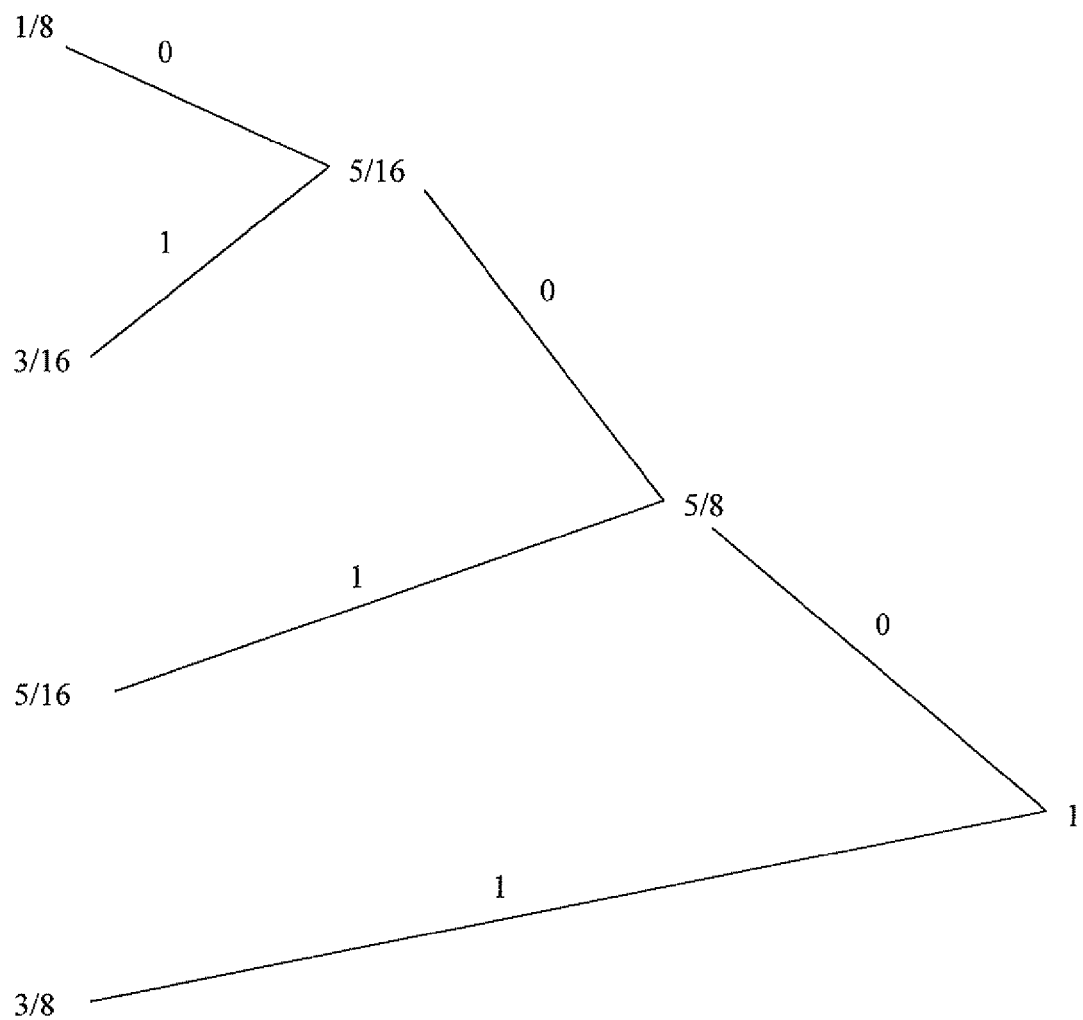
FIGS. 6 and 7 are reverse Huffman trees for approximating a desired predefined probability distribution in the programming of MLC cells.

FIG. 6 shows the reverse Huffman tree for n=1. The four leaves of the tree, on the left side of the tree, correspond to the four programmed levels of a single cell and are labeled top-down with the corresponding target probabilities. The branches of the tree are constructed, top down and left to right, by joining existing nodes. Each node, other than the leaves and the root node, has two branches to its left and one branch to its right. The leaves have only single branches to their right. The root node has only two branches to its left. Each node, other than the leaves, is labeled by the sum of the labels of the two nodes to which it is connected by the branches to its left. In extending the tree by constructing a branch to the right of an existing node, if the branch could go up to the right or down to the right, the direction that is chosen is determined by the label of the resulting node: the direction that gives the lower label is chosen. In case of a tie, both trees are constructed and the tree that gives the better approximation to the target probability distribution is the tree that is used. Finally, branches that go up to the right are labeled with "1" bits and branches that go down to the right are labeled with "0" bits.

Figure 6A:
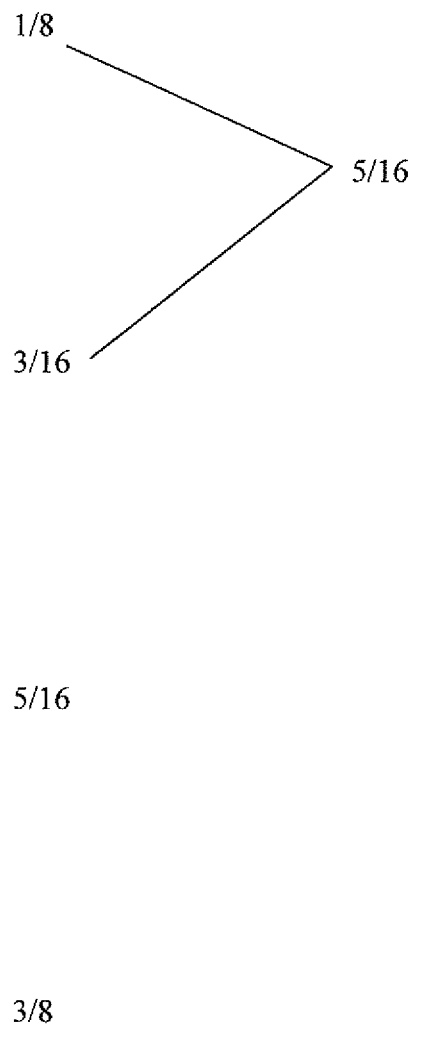
Figure 6B:
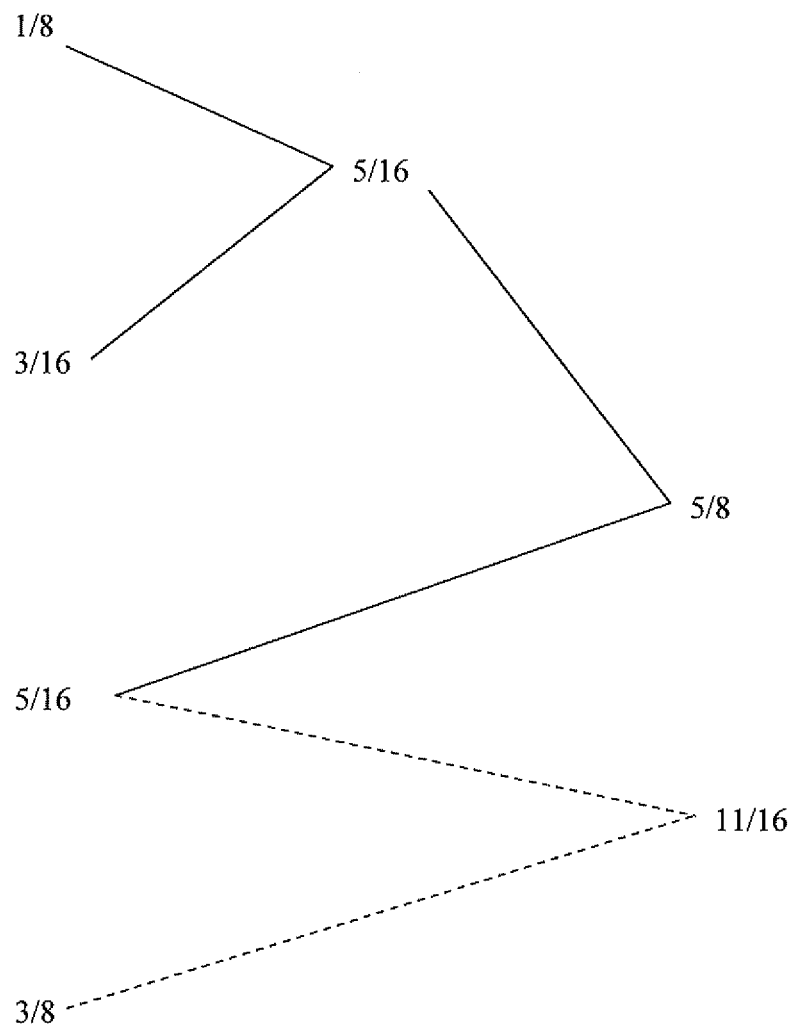
Figure 6C:
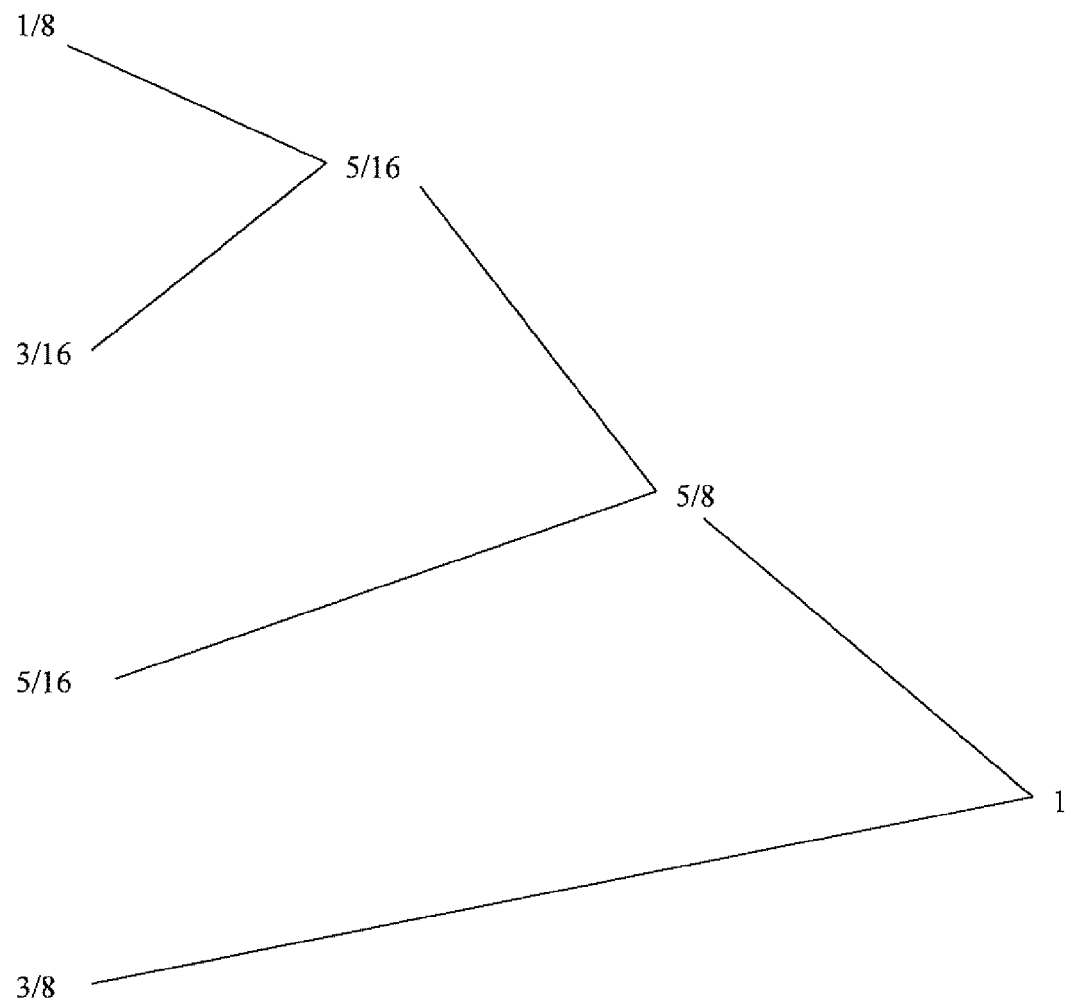

The three stages in the construction of the tree of FIG. 6 are shown in FIGS. 6A-6C. In FIG. 6A, the top two leaves are connected (this is the only way to connect the two leaves) to give the first intermediate node. In FIG. 6B, a branch from the third leaf down could be constructed up to a node that is connected to the first intermediate node and that is labeled by 5/16+5/16=⅝ or down to a node that is connected to the bottom leaf and that is labeled by 5/16+⅜=11/16. 11/16>⅝ so the upward construction is selected. In FIG. 6C the second intermediate node is connected to the bottom leaf.

The input bit sequences of the encoding now are read from the tree starting from the root node and going bottom to top and right to left. The first input bit sequence is the label of the branch from the root node to the lowest leaf, "1". The second input bit sequence is the concatenation of the labels of the path from the root node to the second leaf up: "01". The third input bit sequence is the concatenation of the labels of the path from the root node to the third leaf up: "001". The fourth input bit sequence is the concatenation of the labels of the path from the root node to the top leaf: "000". The encoding itself is a mapping from the input bit sequences to the corresponding bit sequences of the mapping to programmed levels:

| Input Bit Sequence | Transformed Bit Sequence |
|---|---|
| 1 | 00 |
| 01 | 01 |

| Input Bit Sequence | Transformed Bit Sequence |
|---|---|
| 001 | 11 |
| 000 | 10 |

For example, this encoding transforms the input bit string "11011001" into the transformed bit string "0000010011". The corresponding voltage level distribution is (½, ¼, ⅛, ⅛).

The labeling of branches of the reverse Huffman tree that go up to the right with "1" and of the branches of the reverse Huffman tree that go down to the right with "0" is an arbitrary convention. The opposite convention also works. In the case of the reverse Huffman tree of FIG. 6, using the opposite convention gives the following encoding:

| Input Bit Sequence | Transformed Bit Sequence |
|---|---|
| 0 | 00 |
| 10 | 01 |
| 110 | 11 |
| 111 | 10 | which also has the voltage level distribution (½, ¼, ⅛, ⅛).

Figure 7:
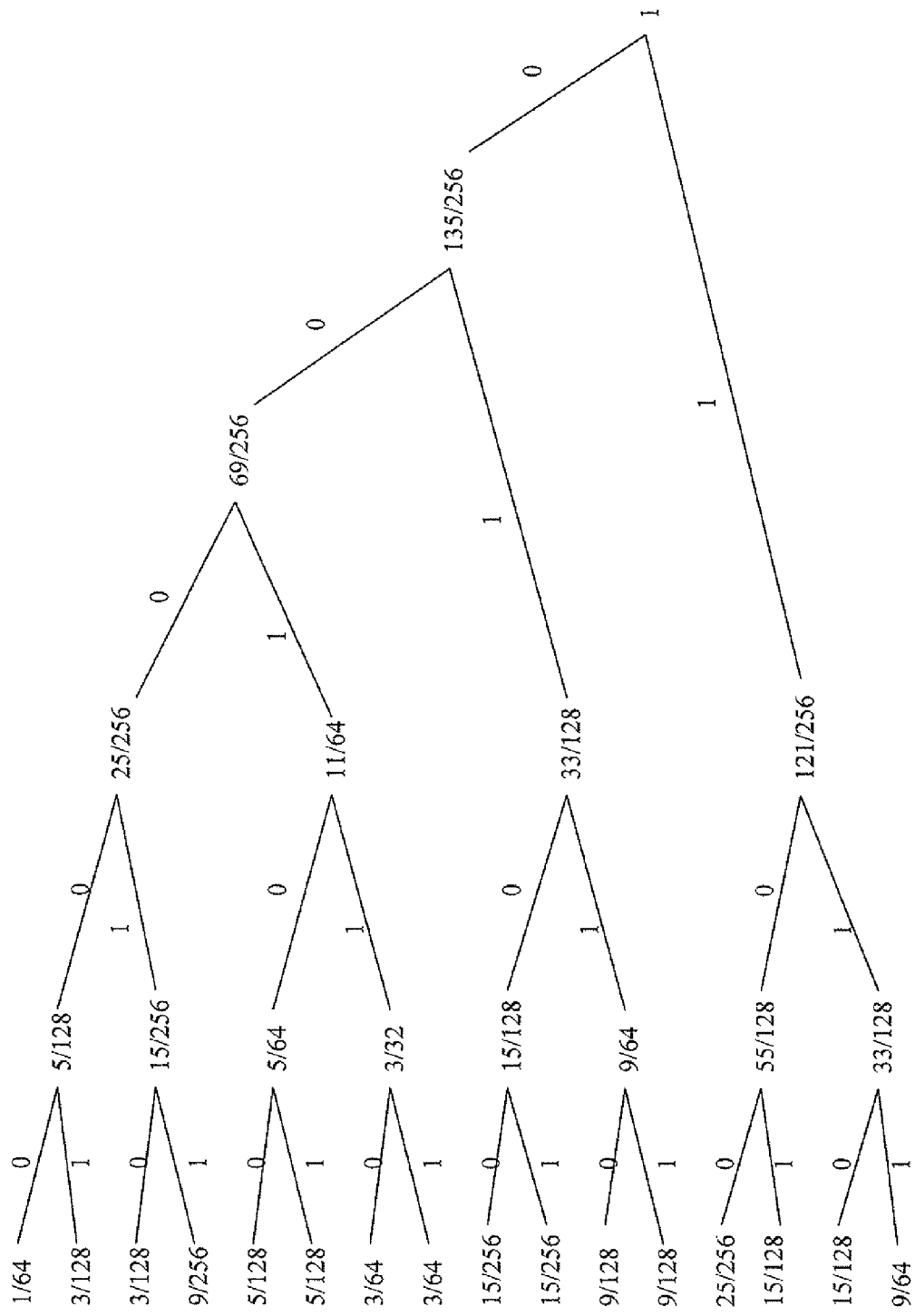

FIG. 7 shows the reverse Huffman tree for n=2. The sixteen leaves correspond to the sixteen ways of pairing the programmed levels of two cells, and are labeled by the products of the target probabilities of the corresponding voltage levels, which are the target probabilities of the corresponding programmed level pairs. The corresponding encoding is

| Input Bit Sequence | Transformed Bit Sequence |
|---|---|
| 111 | 0000 |
| 110 | 0001 |
| 101 | 0100 |
| 100 | 0101 |
| 0111 | 0011 |
| 0110 | 1100 |
| 0101 | 0111 |
| 0100 | 1101 |
| 00111 | 0010 |
| 00110 | 1000 |
| 00101 | 0110 |
| 00100 | 1001 |
| 00011 | 1111 |
| 00010 | 1110 |
| 00001 | 1011 |
| 00000 | 1010 |

The corresponding probability distribution is (11/32, 11/32, 3/16, ⅛) which is closer to the target probability distribution than the n=1 probability distribution.

If it is desired to approach the target probability distribution even more closely, reverse Huffman encodings with n=3, 4, etc. are constructed. The leaves of the n-th tree are labeled with the $4^n$ possible n-fold products of the target probabilities.

Other methods, such as deterministic encodings based on non-bijective mappings (mappings that are either not one-to-one or not onto), may be used for inducing the desired distribution of programming levels over the programmed cells during the first programming cycle. The following is an example of a mapping, of two-bit bit sequences into threshold voltage levels of a three-level flash memory cell, that is not one-to-one:

| Bit Sequence | Voltage Level |
|---|---|
| 0 0 | 0 |
| 0 1 | 1 |
| 1 1 | 2 |
| 1 0 | 2 |

(The loss of information associated with mapping both "1 1" and "1 0" to the second voltage level is overcome using appropriate ECC.) The following is an example of a mapping, of three-bit bit sequences into threshold voltage levels of two three-level flash memory cells, that is not onto.

| Bit Sequence | Voltage Level |
|---|---|
| 0 0 0 | 0, 0 |
| 0 0 1 | 0, 1 |
| 0 1 1 | 0, 2 |
| 0 1 0 | 1, 2 |
| 1 1 0 | 2, 2 |
| 1 1 1 | 2, 1 |
| 1 0 1 | 2, 0 |
| 1 0 0 | 1, 0 |

Second Programming Cycle:

In the second programming cycle, the page that was programmed with the codeword $C_1$ in the first programming cycle is programmed with a codeword $C_2$, such that the voltage in each of the cells that was already programmed in the first programming cycle cannot decrease during the second programming cycle. This requires using a "coset" code, in which every information sequence has several codeword representations such that at least one representation satisfies the requirement that the programming levels induced by $C_2$ are greater or equal than the programming levels that are induced by $C_1$.

Alternatively, a more relaxed constraint can be used, requiring that with high probability the programming levels induced by $C_2$ are greater or equal than the programming levels that are induced by $C_1$. Another option is to use a deterministic criterion, requiring that the programming levels induced by $C_2$ are greater or equal than the programming levels that are induced by $C_1$ except at most 'q' elements ('q' cells or 'q' programming levels of cells).

Optionally, it may be required that the vector, comprising the programming levels of the programmed cells according to $C_2$, satisfy some constraint (e.g. a norm constraint or a probability distribution constraint) that allows further programming cycles (of a codeword $C_3$ and then of a codeword $C_4$, etc.) before erase.

General Remark:—we may consider the case in which $C_2$ does not necessarily satisfy all the constraints imposed in the programming of $C_1$ in the first cycle. In this case some of the cells are in error during the second programming cycle (as $C_2$ requires cell voltage to decrease, which is not possible). This is OK if the number of such cells is sufficiently small, as usually the codes $C_1$ and $C_2$ also incorporate ECC functionality.

The following is a discussion of an efficient implementation of the second programming phase for MLC flash cells.

Suppose the number of states of each MLC cell is $2^t$. The binary coding schemes described above for programming SLC flash cells a second time without erasure may be generalized to MLC flash cells in a straightforward manner by imposing ti binary constraints that may arise from the values that were programmed to the cells during the first programming cycle. When using the algebraic scheme, the tl possible binary constraints require using tl+1 redundancy bits corresponding to t+1 redundancy cells. However, a more efficient approach can be used, one that requires fewer redundant cells compared to this straightforward generalization of the SLC scheme.

Consider a normal mapping between sequences of l bits and the programming levels. For example for l=3, the binary string 111 could be associated with the lowest state, followed by 110, 101 and 100. These four states are followed by the four states whose most significant bit is 0, i.e. 011, 010, 001 and 000.

Suppose, that during the first programming cycle t=4 cells were programmed, while other cells were kept erased (e.g. during the first programming cycle we make sure that no more than 't' cells are programmed). Then, the naïve solution for the second programming coding requires handling up to 11=12 constraints. When using the algebraic scheme described above, this would require allocating tl+1=13 redundancy bits, which translate to five redundancy cells.

However, in practice it suffices to impose a smaller number of binary constraints in order to ensure that the vector of programming levels induced by $C_2$ can be programmed to the cells. For example, assume that a cell is programmed to one of the four states 110, 100, 101 and 001 during the first programming cycle. Then one constraint is sufficient to ensure that the second programming of the cell assigns the cell to a state which is not lower than the currently programmed state.

Consider, for example, the following Gray mapping between bits and states in the case of three-bit cells (eight levels):

| Bit Sequence MSBit→1 1 1←LSBit | Programming Level Erased |
|---|---|
| 1 1 0 | A |
| 1 0 0 | B |
| 1 0 1 | C |
| 0 0 1 | D |
| 0 0 0 | E |
| 0 1 0 | F |
| 0 1 1 | G |

The constraint equation may be common to all four cases, and may require that the most significant bit is programmed to 0. Alternatively, the constraint can be specific for each case, for example, constraining the least significant bit to be 0 if the cell was initially programmed to 110, which insures that the level will be 'A' or above even though levels 'C', 'D' and 'G' are forbidden in this case but we still gain that only one constraint is imposed instead of three constraints.

Another possible constraint is constraining the middle bit to be 0 if the cell was initially programmed to 100. Again, states 'F' and 'G' are "lost" but instead of three constraints it is sufficient to have one constraint. Another possible constraint is in the case that 001 is programmed in the first programming cycle. All that is required is to constrain the most significant bit to be 0. In this case there are no forbidden states which could have been used otherwise.

If the cell was initially programmed to 010 for example then two constraints are needed. Only if the cell was initially programmed to 011 do we need all three constraints.

Assuming that each of the eight possible initially programmed values has equal probabilities, then the expected number of constraints per cell is:

$$R = \frac{1}{8} \cdot (0+1+1+1+1+2+2+3) = 11/8 \quad (10)$$

For t=4 cells that can be programmed during the first programming cycle, the expected number of binary constraints is 4*11/8=5.5. Hence, a redundancy of six bits should be sufficient in order to satisfy all the constraints with high probability. So the number of redundant cells required is only two, compared to five cells for the naïve approach.

In general, the number of redundancy bits per constrained cell required for this scheme is:

$$R = \sum_i p_i c_i \quad (11)$$

where $p_i$ is the probability of a cell having been programmed to programming level i during the first programming cycle and $c_i$ is the number of constraints for state i. This means that in order to minimize the required redundancy of the scheme it is desired to optimize the probability distribution $P = (p_0 p_1 \ldots p_{2^l-1})$ induced over the $2^l$ programming levels of the cells during the first programming cycle. Hence, in the first programming cycle we use a shaping code such as the reverse Huffman encoding scheme discussed above in order to induce a desired probability distribution P.

Then in the second programming cycle we use a coset code based on either the erasure encoding scheme or the algebraic code, where in both cases we impose a minimal number of restrictions on the bits of $C_2$ in order to make sure that each cell will be programmed to a higher or the same state in the second programming cycle (with certainty or with high probability) compared with the first programming cycle. Note that in the algebraic approach the constraints are limited to forcing certain bits to "0" (in order to have a homogeneous sete of equations with a guaranteed non-trivial solution). If it is desired to use arbitrary constraints (i.e. a bit may be constrained to either "0" or "1") then a solution may not be guaranteed for the encoding. If there is no solution, the information may be programmed as is, such that a second programming without erase is not possible. In the iterative approach, the constraints are not limited: certain bits can be constrained to either "0" or "1".

The probability distribution P can be optimized as follows, in order to minimize the required redundancy:

$$P = \arg\min_{P=\{p_0, \ldots p_{2^l-1}\}} \left\{\max\left[l + \sum_i p_i \log(p_i), \sum_i p_i c_i\right]\right\} \quad (12)$$

Note that this optimization reduces to the optimization described by equation (3) for the case of SLC.

The first term in equation (12), $$l + \sum_i p_i \log_2(p_i),$$

is the number of redundancy bits per cell required in the first programming cycle in order to induce the shaped distribution P. This term is explained by the fact that a cell, that can store l bits, can store only $$H(P) = -\sum_i p_i \log_2(p_i)$$

information bits if the probability distribution over the programmed states is P. Therefore the number of redundancy bits per cell in the first programming cycle is $$l - H(P) = l + \sum_i p_i \log_2(p_i).$$

The second term in equation (12) is $$\sum_i p_i c_i.$$

This is the number of redundancy bits per cell required in the second programming cycle. This term follows immediately from the fact that the first programming cycle is performed with the distribution P and hence dictates the number of constraints for the coset code. For each constraint we need one extra redundant bit and therefore this term provides the average number of redundant bits per cell.

For each distribution P the redundancy must be big enough for both the first and second encodings, therefore the required number of redundant bits per cell for the distribution P is $$\max\left\{l + \sum_i p_i \log_2(p_i), \sum_i p_i c_i\right\}$$

and the minimal required redundancy is achieved by minimizing over all distributions P.

For example, a numerical optimization of equation (12) for the three-bit-per-cell mapping above results in P=(0.4472, 0.1199, 0.1199, 0.1199, 0.1199, 0.0324, 0.0324, 0.0084). As the optimization was done numerically, the result may represent a local minimum and a better probability distribution may exist. Nevertheless, the optimized probability distribution results in an overhead of only:

$$\frac{n-k}{k} = \frac{\min\limits_{P=\{p_0, \ldots p_{2^l-1}\}} \left\{\max\left[l + \sum_i p_i \log_2 p_i, \sum_i p_i c_i\right]\right\}}{l - \min\limits_{P=\{p_0, \ldots p_{2^l-1}\}} \left\{\max\left[l + \sum_i p_i \log_2 p_i, \sum_i p_i c_i\right]\right\}}$$

$$= \frac{0.6345}{3 - 0.6345}$$

$$= 26.82\%$$

in order to allow two programmings of three-bit cells without erasing the cells between the two programming cycles. In terms of redundancy, the optimized probability distribution results in a redundancy of:

$$\frac{n-k}{n} = \frac{\min\limits_{P=\{p_0, \ldots p_{2^l-1}\}} \left\{\max\left[l + \sum_i p_i \log_2 p_i, \sum_i p_i c_i\right]\right\}}{l}$$

$$= \frac{0.6345}{3}$$

$$= 21.15\%$$

Comparing these results to the optimized overhead of SLC cells, given by equations (3) and (4), it is evident that programming three-bit MLC cells twice without erasing between the programming cycles requires less overhead/redundancy compared to programming SLC cells twice without erasing between the programming cycles.

Figure 8:
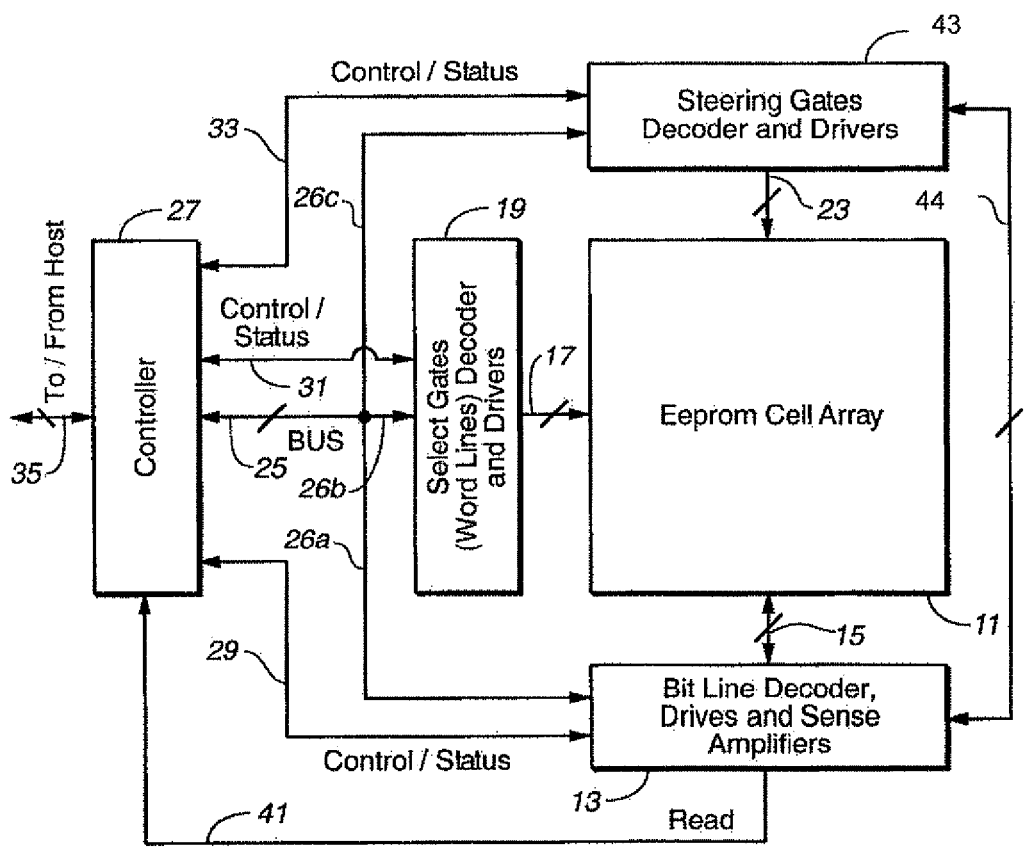
FIG. 8 is a high-level schematic block diagram of a flash memory device for storing input bits as described herein.

FIG. 8 is a high-level schematic block diagram of a flash memory device. A large number of individually addressable memory cells are arranged in a regular array 11 of rows and columns. Individual memory cells can be controlled by bit lines, select gates arranged in word lines, and steering gates. Bit lines are designated herein to extend along columns of array 11, and word lines are designated to extend along the rows of array 11. Bit line unit 13 may include a bit line decoder, storage elements, driver circuits and sense amplifiers. Bit line unit 13 can be coupled to cell array 11 by line 15, and to controller 27 by bit-control line 29 and by read line 41. Word line unit 19 may include a select gate decoder and driver circuits. Word line unit 19 can be coupled to cell array 11 by line 17, and to controller 27 by word-control line 31. Steering line unit 43 may include a steering gate decoder and driver circuits. Steering unit 43 can be coupled to cell array 11 by line 23, to controller 27 by steering-control line 33, and to bit line unit 13 by line 44. Bit line unit 13, word line unit 19 and steering unit 43 can be coupled to bus 25, which in turn is coupled to controller 27. Controller 27 can be coupled to the host by line 35.

When a pre-selected memory cell is to be programmed, voltages can be applied to the bit lines, word line and steering gates, corresponding to the pre-selected memory cell, at predetermined levels sufficient for the programming of the pre-selected cell. Controller 27 sends the address of the pre-selected memory cell through bus 25 to the respective decoders in bit line unit 13, word line unit 19, and steering gate unit 43 through lines 26a, 26b, and 26c, respectively. Status and control commands between bit line unit 13, word line unit 19, steering gate unit 43 and controller 27 are communicated through bit-control line 29, word-control line 31 and steering control line 33.

When a pre-selected memory cell is to be read, voltages can be applied to the corresponding bit lines, word line and steering gates, corresponding to the pre-selected memory cell, at predetermined levels, sufficient to enable the reading of the pre-selected memory cell. Controller 27 is capable of applying the voltages of the bit lines through bit-control line 29, applying the voltages of the word lines through word-control line 31 and applying the voltages of steering gates through steering control line 33. A current can be generated through the pre-selected memory cell by these voltages. The current is indicative of whether the pre-selected memory cell was programmed or not (in the case of the cells of array 11 having been programmed one bit per cell) or of the bit pattern that has been stored in the pre-selected memory cell (in the case of the cells of array 11 having been programmed with more than one bit per cell). The value of the current can be amplified and compared against references by sense amplifiers in bit line unit 13, the result of which can be temporarily stored in latches or registers. The resultant data, read out from the pre-selected memory cell, can be sent to controller 27 through read line 41.

When writing information bits to memory cell array 11, controller 27 uses the encoding methodology described above in order to attempt to program two different sets of information bits successively to cells (e.g. the cells of a word line) of memory cell array 11 (the second set of information bits replaces the first set of information bits) without erasing the cells before programming the second set of information bits. When reading data stored in memory cell array 1, controller 27 recovers the information bits by inverting the encoding that was used to store the information bits. Controller 27 keeps track of which encoding, a first programming cycle encoding (e.g. a reverse Huffman tree encoding) or a second programming cycle encoding (a coset encoding), was used to encode the stored data.

Figure 9:
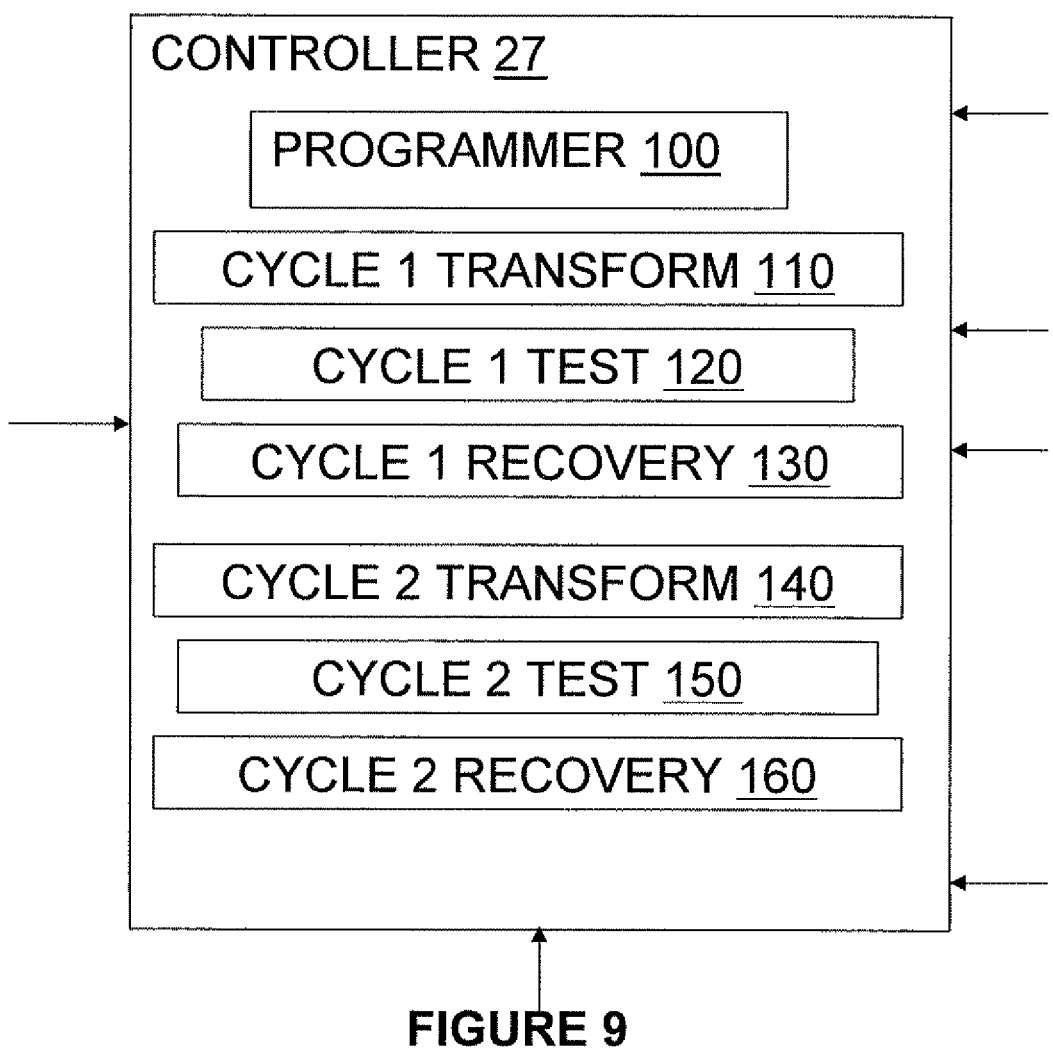
FIG. 9 is a partial functional block diagram of the controller of FIG. 8.

FIG. 9 is a partial functional block diagram of controller 27, showing that the functional blocks of controller 27 include: a programming block 100 for programming cell array 11 with the transformed bits of the first and second cycles according to a mapping of bit sequences to programmed cell levels; a first cycle transforming block 110 for transforming the input bits of the first cycle into transformed bits; a first cycle testing block 120 for determining whether the transformed bits of the first cycle can be programmed to the number of cells of cell array 11 that are available for such programming; a first cycle recovery block 130 for dealing with the eventuality that the transformed bits of the first cycle cannot be programmed to the number of cells of cell array 11 that are available for such programming; a second cycle transforming block 140 for transforming the input bits of the second cycle into transformed bits; a second cycle testing block 150 for determining whether the levels, of the cells that are storing the transformed bits of the first cycle, that would be needed to store the transformed bits of the second cycle, are accessible from the current levels of the cells that are storing the transformed bits of the first cycle; and a second cycle recovery block 160 for dealing with the eventuality that the levels, of the cells that are storing the transformed bits of the first cycle, that would be needed to store the transformed bits of the second cycle, are not accessible from the current levels of the cells that are storing the transformed bits of the first cycle. The functional blocks of controller 27 may be implemented in hardware, in firmware, or as combinations of hardware and/or firmware and/or software.

Figure 10:
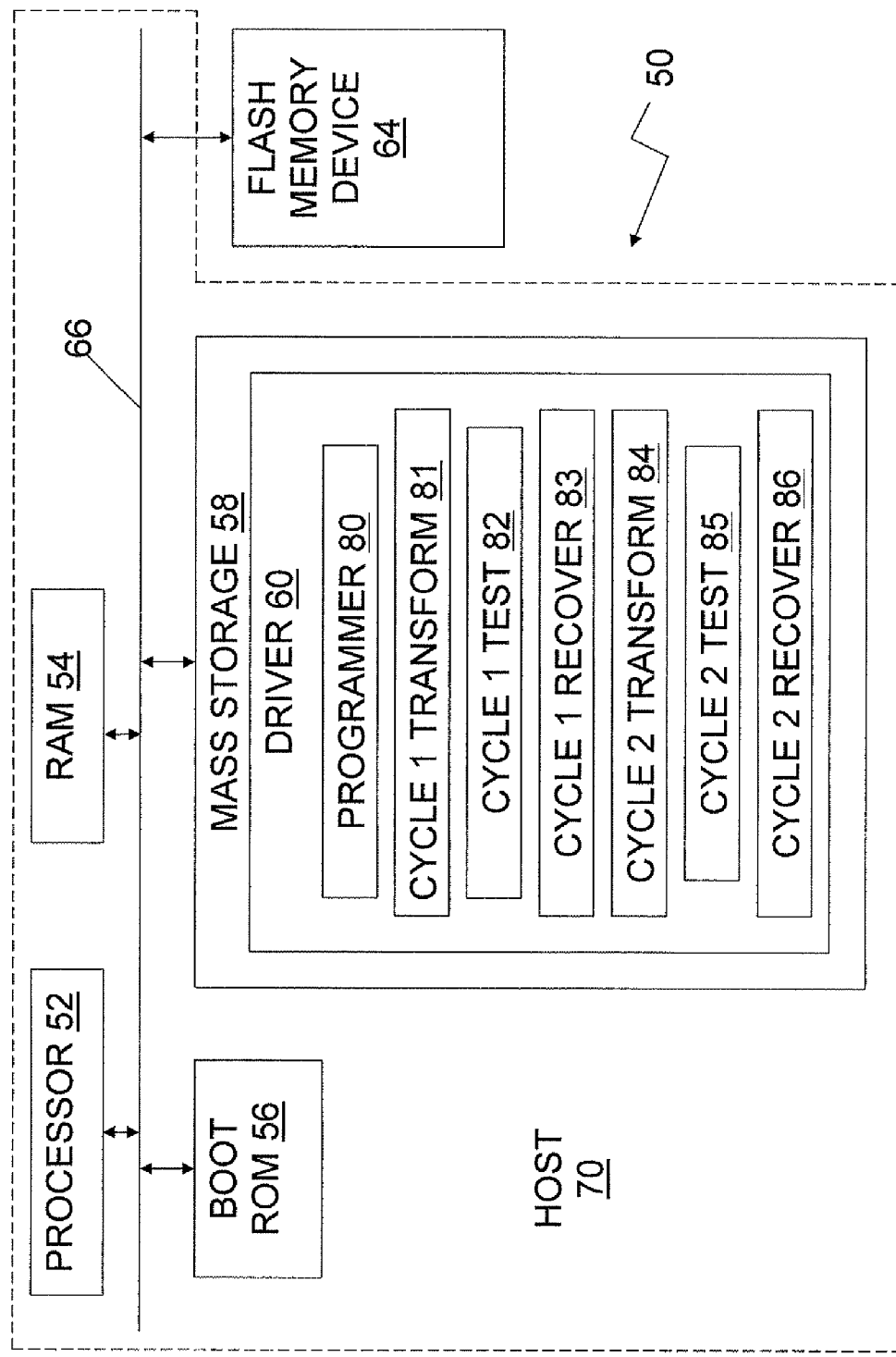
FIG. 10 is a high-level block diagram of a system for storing input bits as described herein.

FIG. 10 is a high-level block diagram of a system 50. System 50 includes a processor 52 and four memory devices: a RAM 54, a boot ROM 56, a mass storage device (hard disk) 58 and a prior art flash memory device 64, all communicating via a common bus 66. Flash memory device 64 could include, for example, the components of the flash memory device of FIG. 8 other than controller 27, as system 50 emulates the functionality of controller 27 by executing software. A software driver 60 of flash memory device 64 is stored in mass storage device 58 and is executed by processor 52 to access flash memory device 64. Driver 60 includes software modules 80, 81, 82, 83, 84, 85 and 86 that correspond to functional blocks 100, 110, 120, 130, 140, 150 and 160 of controller 27.

In FIG. 10, the components of system 50 other than flash memory device 64 constitute a host 70 of flash memory device 64. Mass storage device 58 is an example of a computer-readable storage medium bearing computer-readable code for implementing the data storage methodology described herein. Other examples of such computer-readable storage media include read-only memories such as CDs bearing such code.

A limited number of embodiments of methods for writing data two or more times to the cells of a flash memory without intervening erasures, and of a device and system that use the methods, have been described. It will be appreciated that many variations, modifications and other applications of the methods, device and system may be made.

What is claimed is:

1. A method of attempting to store, successively, in a plurality of memory cells, a first plurality of input bits and a second plurality of input bits, comprising:

(a) providing a mapping of bit sequences to cell levels of the memory cells, wherein the cell levels for each memory cell comprise a lower level and an upper level with each lower level having a lower threshold voltage than the corresponding upper level;

(b) transforming the first plurality of input bits to a first plurality of transformed bits, using a first transformation, wherein the first transformation is biased downwards towards the lower half of the cell levels such that programming the transformed bits according to the mapping would result in more memory cells being programmed to the lower half of the cell levels than to the upper half of the cell levels;

(c) programming at least a first portion of the memory cells to store the first plurality of transformed bits according to the mapping; and (d) subsequent to the programming of the at least first portion of the memory cells, and without erasing at least a second portion of the memory cells that includes the at least first portion of the memory cells:

(i) determining, for the at least second portion of the memory cells, whether respective levels, of the at least second portion of the memory cells, that represent, according to the mapping, a second plurality of transformed bits obtained by transforming the second plurality of input bits using a second transformation, are accessible from the current respective cell levels of the at least second portion of the memory cells, wherein the second plurality of transformed bits are a representation of a codeword selected from a plurality of codeword representations of the second plurality of input bits generated using the second transformation, and (ii) only if the respective levels, of the at least second portion of the memory cells, that represent, according to the mapping, the second plurality of transformed bits obtained by transforming the second plurality of input bits using the second transformation, are accessible from the current respective cell levels of the at least second portion of the memory cells: programming the at least second portion of the memory cells to store the second plurality of transformed bits according to the mapping.

2. The method of claim 1, wherein the second plurality of input bits is equal in number to the first plurality of input bits.

3. The method of claim 1, wherein the first transformation is a variable-output-length transformation.

4. The method of claim 3, wherein the first transformation includes a variable-length prefix encoding of the first plurality of input bits.

5. The method of claim 4, wherein the variable-length prefix encoding is selected from the group consisting of a reverse Huffman encoding and a reverse arithmetic encoding.

6. The method of claim 4, wherein each memory cell has more than two cell levels, and wherein the method further comprises:

(e) designing the variable-length prefix encoding to induce a predefined probability distribution over the cell levels.

7. The method of claim 6, wherein the predefined probability distribution is optimized relative to a number of redundancy bits per constrained cell for the programming of the at least second portion of the memory cells.

8. The method of claim 6, wherein a number of redundancy bits per constrained cell for the programming of the at least second portion of the memory cells is chosen in accordance with the predefined probability distribution.

9. The method of claim 6, wherein each memory cell has at least eight cell levels and wherein the programming of the at least second portion of the memory cells requires an overhead of at most about 27%.

10. The method of claim 1, wherein the first transformation is a fixed-output-length transformation.

11. The method of claim 10, wherein the first transformation includes trellis encoding of the first plurality of input bits.

12. The method of claim 10, wherein the first transformation includes reverse enumerative source encoding of the first plurality of input bits.

13. The method of claim 10, wherein the first transformation includes an encoding based on a non-bijective mapping of the first plurality of input bits.

14. The method of claim 1, further comprising: (e) prior to programming the at least first portion of the memory cells to store the first plurality of transformed bits according to the mapping: erasing the at least first portion of the memory cells.

15. The method of claim 1, wherein the second transformation includes algebraic coset encoding of the second plurality of input bits.

16. The method of claim 1, wherein the second transformation includes erasure coset encoding of the second plurality of input bits to produce an erasure coset codeword.

17. The method of claim 16, wherein the erasure coset encoding includes a plurality of hard constraints on the second plurality of transformed bits.

18. The method of claim 16, wherein the erasure coset encoding includes a plurality of soft constraints on the second plurality of transformed bits.

19. The method of claim 16, wherein the erasure coset encoding is iterative.

20. The method of claim 16, wherein the second transformation includes finding at least one error correction redundancy bit such that error correction decoding of a combination of the erasure coset codeword and the at least one error correction redundancy bit, followed by erasure coset decoding of the results of the error correction decoding, reproduces the second plurality of input bits.

21. The method of claim 1, wherein, following the determining step, if the respective levels, of the at least second portion of the memory cells, that represent, according to the mapping, the second plurality of transformed bits obtained by transforming the second plurality of input bits using the second transformation, are inaccessible from the current respective cell levels of the at least second portion of the memory cells: erasing the at least second portion of the memory cells and then programming the at least second portion of memory cells to store the second plurality of input bits according to the mapping.

22. A memory device comprising:
(a) a plurality of memory cells; and
(b) a controller operative to attempt to store, successively, in the plurality of memory cells, a first plurality of input bits and a second plurality of input bits, by:
  (i) transforming the first plurality of input bits to a first plurality of transformed bits, using a first transformation,
  (ii) programming at least a first portion of the memory cells to store the first plurality of transformed bits according to a mapping of bit sequences to cell levels of the memory cells, wherein the cell levels for each memory cell comprise a lower level and an upper level with each lower level having a lower threshold voltage than the corresponding upper level and wherein the first transformation is biased downwards towards the lower half of the cell levels such that programming the transformed bits according to the mapping would result in more memory cells being programmed to the lower half of the cell levels than to the upper half of the cell levels, and
  (iii) subsequent to the programming of the at least first portion of the memory cells, and without erasing at least a second portion of the memory cells that includes the at least first portion of the memory cells:
    (A) determining, for the at least second portion of the memory cells, whether respective levels, of the at least second portion of the memory cells, that represent, according to the mapping, a second plurality of transformed bits obtained by transforming the second plurality of input bits using a second transformation, are accessible from the current respective cell levels of the at least second portion of the memory cells, wherein the second plurality of transformed bits are a representation of a codeword selected from a plurality of codeword representations of the second plurality of input bits generated using the second transformation, and
    (B) only if the respective levels, of the at least second portion of the memory cells, that represent, according to the mapping, the second plurality of transformed bits obtained by transforming the second plurality of input bits using the second transformation, are accessible from the current respective cell levels of the at least second portion of the memory cells: programming the at least second portion of the memory cells to store the second plurality of transformed bits according to the mapping.

23. A system for storing input bits, comprising:
(a) a memory device that includes a plurality of memory cells; and
(b) a processor operative to attempt to store, successively, in the plurality of memory cells, a first plurality of the input bits and a second plurality of the input bits, by:
  (i) transforming the first plurality of the input bits to a first plurality of transformed bits, using a first transformation,
  (ii) programming at least a first portion of the memory cells to store the first plurality of transformed bits according to a mapping of bit sequences to cell levels of the memory cells, wherein the cell levels for each memory cell comprise a lower level and an upper level with each lower level having a lower threshold voltage than the corresponding upper level and wherein the first transformation is biased downwards towards the lower half of the cell levels such that programming the transformed bits according to the mapping would result in more memory cells being programmed to the lower half of the cell levels than to the upper half of the cell levels, and
  (iii) subsequent to the programming of the at least first portion of the memory cells, and without erasing at least a second portion of the memory cells that includes the at least first portion of the memory cells:
    (A) determining, for the at least second portion of the memory cells, whether respective levels, of the at least second portion of the memory cells, that represent, according to the mapping, a second plurality of transformed bits obtained by transforming the second plurality of the input bits using a second transformation, are accessible from the current respective cell levels of the at least second portion of the memory cells, wherein the second plurality of transformed bits are a representation of a codeword selected from a plurality of codeword representations of the second plurality of input bits generated using the second transformation, and (B) only if the respective levels, of the at least second portion of the memory cells, that represent, according to the mapping, the second plurality of transformed bits obtained by transforming the second plurality of the input bits using the second transformation, are accessible from the current respective cell levels of the at least second portion of the memory cells: programming the at least second portion of the memory cells to store the second plurality of transformed bits according to the mapping.

24. A non-transitory computer-readable storage medium having computer-readable code embodied in the computer-readable storage medium, the computer-readable code for storing input bits in a plurality of memory cells, the computer-readable code comprising program code for attempting to store, successively, in the plurality of memory cells, a first plurality of the input bits and a second plurality of the input bits, by:

(a) transforming the first plurality of the input bits to a first plurality of transformed bits, using a first transformation;

(b) programming at least a first portion of the memory cells to store the first plurality of transformed bits according to a mapping of bit sequences to cell levels of the memory cells, wherein the cell levels for each memory cell comprise a lower level and an upper level with each lower level having a lower threshold voltage than the corresponding upper level and wherein the first transformation is biased downwards towards the lower half of the cell levels such that programming the transformed bits according to the mapping would result in more memory cells being programmed to the lower half of the cell levels than to the upper half of the cell levels; and (c) subsequent to the programming of the at least the first portion of the memory cells, and without erasing at least a second portion of the memory cells that includes the at least the first portion of the memory cells:

(i) determining, for the at least second portion of the memory cells, whether respective levels, of the at least second portion of the memory cells, that represent, according to the mapping, a second plurality of transformed bits obtained by transforming the second plurality of the input bits using a second transformation, are accessible from the current respective cell levels of the at least second portion of the memory cells, wherein the second plurality of transformed bits are a representation of a codeword selected from a plurality of codeword representations of the second plurality of input bits generated using the second transformation, and (ii) only if the respective levels, of the at least second portion of the memory cells, that represent, according to the mapping, the second plurality of transformed bits obtained by transforming the second plurality of the input bits using the second transformation, are accessible from the current respective cell levels of the at least second portion of the memory cells:
programming the at least second portion of the memory cells to store the second plurality of transformed bits according to the mapping.

25. A method of attempting to store, successively, in a plurality of memory cells, a first plurality of input bits and a second plurality of input bits, comprising:

(a) providing a mapping of bit sequences to cell levels of the memory cells, wherein the cell levels for each memory cell comprise a lower level and an upper level with each lower level having a lower threshold voltage than the corresponding upper level;

(b) transforming the first plurality of input bits to a first plurality of transformed bits, using a first transformation that has a variable output length, wherein the first transformation is biased downwards towards the lower half of the cell levels such that programming the transformed bits according to the mapping would result in more memory cells being programmed to the lower half of the cell levels than to the upper half of the cell levels;

(c) determining whether the first plurality of transformed bits is small in number such that at least a first portion of the memory cells are programmable to store the first plurality of transformed bits according to the mapping; and (d) only if the first plurality of transformed bits is small in number such that the at least first portion of the memory cells are programmable to store the first plurality of transformed bits according to the mapping:

(i) programming the at least first portion of the memory cells to store the first plurality of transformed bits according to the mapping, (ii) transforming the second plurality of input bits to a second plurality of transformed bits, using a second transformation such that, for at least a second portion of the memory cells that includes the at least first portion of the memory cells, respective cell levels of the at least second portion of the memory cells that represent the second plurality of transformed bits according to the mapping are accessible from the current respective cell levels of the at least second portion of the memory cells, wherein the second plurality of transformed bits are a representation of a codeword selected from a plurality of codeword representations of the second plurality of input bits generated using the second transformation, and (iii) programming the at least second portion of the memory cells to store the second plurality of transformed bits according to the mapping without erasing the at least second portion of the memory cells between the programming of the at least first portion of the memory cells to store the first plurality of transformed bits and the programming of the at least second portion of the memory cells to store the second plurality of transformed bits.

26. The method of claim 25, wherein the second plurality of input bits is equal in number to the first plurality of input bits.

27. The method of claim 25, wherein the first transformation includes a variable-length prefix encoding of the first plurality of input bits.

28. The method of claim 27, wherein the variable-length prefix encoding is selected from the group consisting of a reverse Huffman encoding and a reverse arithmetic encoding.

29. The method of claim 27, wherein each memory cell has more than two cell levels, and wherein the method further comprises:

(e) designing the variable-length prefix encoding to induce a predefined probability distribution over the cell levels.

30. The method of claim 29, wherein the predefined probability distribution is optimized relative to a number of redundancy bits per constrained cell for the programming of the at least second portion of the memory cells.

31. The method of claim 29, wherein a number of redundancy bits per constrained cell for the programming of the at least second portion of the memory cells is chosen in accordance with the predefined probability distribution.

32. The method of claim 29, wherein each memory cell has at least eight cell levels and wherein the programming of the at least second portion of the memory cells requires an overhead of at most about 27%.

33. The method of claim 25, wherein the second transformation includes algebraic coset encoding of the second plurality of input bits.

34. The method of claim 25, wherein the second transformation includes erasure coset encoding of the second plurality of input bits.

35. The method of claim 25, further comprising:
(e) if the first plurality of transformed bits is too large in number for the at least first portion of the memory cells to be programmed to store the first plurality of transformed bits according to the mapping:
  (i) scrambling the first plurality of input bits, thereby providing a plurality of scrambled bits,
  (ii) transforming the plurality of scrambled bits to a third plurality of transformed bits, using the first transformation, and
  (iii) determining whether the third plurality of transformed bits is small in number such that at least a third portion of the memory cells are programmable to store the third plurality of transformed bits according to the mapping.

36. The method of claim 25, wherein the first plurality of input bits is small in number such that at least a third portion of the memory cells are programmable to store the first plurality of input bits according to the mapping, the method further comprising:
(e) if the first plurality of transformed bits is too large in number for the at least first portion of the memory cells to be programmed to store the first plurality of transformed bits according to the mapping: programming the at least third portion of the memory cells to store the first plurality of input bits according to the mapping.

37. A memory device comprising:
(a) a plurality of memory cells; and
(b) a controller operative to attempt to store, successively, in the plurality of memory cells, a first plurality of input bits and a second plurality of input bits, by:
  (i) transforming the first plurality of input bits to a first plurality of transformed bits, using a first transformation that has a variable output length,
  (ii) determining whether the first plurality of transformed bits is small in number such that at least a first portion of the memory cells are programmable to store the first plurality of transformed bits according to a mapping of bit sequences to cell levels of the memory cells, wherein the cell levels for each memory cell comprise a lower level and an upper level with each lower level having a lower threshold voltage than the corresponding upper level and wherein the first transformation is biased downwards towards the lower half of the cell levels such that programming the transformed bits according to the mapping would result in more memory cells being programmed to the lower half of the cell levels than to the upper half of the cell levels, and
  (iii) only if the first plurality of transformed bits is small in number such that the at least first portion of the memory cells are programmable to store the first plurality of transformed bits according to the mapping:
    (A) programming the at least first portion of the memory cells to store the first plurality of transformed bits according to the mapping,
    (B) transforming the second plurality of input bits to a second plurality of transformed bits, using a second transformation such that, for at least a second portion of the memory cells that includes the first portion of the memory cells, respective cell levels of the at least second portion of transformed bits according to the mapping are accessible from the current respective levels of the at least second portion of the memory cells, wherein the second plurality of transformed bits are a representation of a codeword selected from a plurality of codeword representations of the second plurality of input bits generated using the second transformation, and
    (C) programming the at least second portion of the memory cells to store the second plurality of transformed bits according to the mapping without erasing the at least second portion of the memory cells between the programming of the at least first portion of the memory cells to store the first plurality of transformed bits and the programming of the at least second portion of the memory cells to store the second plurality of transformed bits.

38. A system for storing input bits, comprising:
(a) a memory device that includes a plurality of memory cells; and
(b) a processor operative to attempt to store, successively, in the plurality of memory cells, a first plurality of the input bits and a second plurality of the input bits, by:
  (i) transforming the first plurality of the input bits to a first plurality of transformed bits, using a first transformation that has a variable output length,
  (ii) determining whether the first plurality of transformed bits is small in number such that at least a first portion of the memory cells are programmable to store the first plurality of transformed bits according to a mapping of bit sequences to cell levels of the memory cells, wherein the cell levels for each memory cell comprise a lower level and an upper level with each lower level having a lower threshold voltage than the corresponding upper level and wherein the first transformation is biased downwards towards the lower half of the cell levels such that programming the transformed bits according to the mapping would result in more memory cells being programmed to the lower half of the cell levels than to the upper half of the cell levels, and
  (iii) only if the first plurality of transformed bits is small in number such that the at least first portion of the memory cells are programmable to store the first plurality of transformed bits according to the mapping:
    (A) programming the at least first portion of the memory cells to store the first plurality of transformed bits according to the mapping,
    (B) transforming the second plurality of the input bits to a second plurality of transformed bits, using a second transformation such that, for at least a second portion of the memory cells that includes the first portion of the memory cells, respective cell levels of the at least second portion of transformed bits according to the mapping are accessible from the current respective levels of the at least second portion of the memory cells, wherein the second plurality of transformed bits are a representation of a codeword selected from a plurality of codeword representations of the second plurality of input bits generated using the second transformation, and
(C) programming the at least second portion of the memory cells to store the second plurality of transformed bits according to the mapping without erasing the at least second portion of the memory cells between the programming of the at least first portion of the memory cells to store the first plurality of transformed bits and the programming of the at least second portion of the memory cells to store the second plurality of transformed bits.

39. A non-transitory computer-readable storage medium having computer-readable code embodied in the computer-readable storage medium, the computer-readable code for storing input bits in a plurality of memory cells, the computer-readable code comprising program code for attempting to store, successively, in the plurality of memory cells, a first plurality of the input bits and a second plurality of the input bits, by:
(a) transforming the first plurality of input bits to a first plurality of transformed bits, using a first transformation that has a variable output length;
(b) determining whether the first plurality of transformed bits is small in number such that at least a first portion of the memory cells are programmable to store the first plurality of transformed bits according to a mapping of bit sequences to cell levels of the memory cells, wherein the cell levels for each memory cell comprise a lower level and an upper level with each lower level having a lower threshold voltage than the corresponding upper level and wherein the first transformation is biased downwards towards the lower half of the cell levels such that programming the transformed bits according to the mapping would result in more memory cells being programmed to the lower half of the cell levels than to the upper half of the cell levels; and
(c) only if the first plurality of transformed bits is small in number such that the at least first portion of the memory cells are programmable to store the first plurality of transformed bits according to the mapping:
(i) programming the at least first portion of the memory cells to store the first plurality of transformed bits according to the mapping,
(ii) transforming the second plurality of input bits to a second plurality of transformed bits, using a second transformation such that, for at least a second portion of the memory cells that includes the first portion of the memory cells, respective cell levels of the at least second portion of transformed bits according to the mapping are accessible from the current respective levels of the at least second portion of the memory cells, wherein the second plurality of transformed bits are a representation of a codeword selected from a plurality of codeword representations of the second plurality of input bits generated using the second transformation, and
(iii) programming the at least second portion of the memory cells to store the second plurality of transformed bits according to the mapping without erasing the at least second portion of the memory cells between the programming of the at least first portion of the memory cells to store the first plurality of transformed bits and the programming of the at least second portion of the memory cells to store the second plurality of transformed bits.

* * * * *